(12) United States Patent
Yoon et al.

(10) Patent No.: US 11,895,828 B2
(45) Date of Patent: Feb. 6, 2024

(54) SEMICONDUCTOR MEMORY DEVICE

(71) Applicant: SK hynix Inc., Gyeonggi-do (KR)

(72) Inventors: Jae Man Yoon, Gyeonggi-do (KR); Jin Hwan Jeon, Gyeonggi-do (KR); Tae Kyun Kim, Gyeonggi-do (KR); Jung Woo Park, Gyeonggi-do (KR); Su Ock Chung, Gyeonggi-do (KR); Jae Won Ha, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 24 days.

(21) Appl. No.: 17/719,990

(22) Filed: Apr. 13, 2022

(65) Prior Publication Data

US 2023/0102043 A1 Mar. 30, 2023

(30) Foreign Application Priority Data

Sep. 30, 2021 (KR) ........................ 10-2021-0130237

(51) Int. Cl.
*H10B 12/00* (2023.01)
(52) U.S. Cl.
CPC ....... *H10B 12/482* (2023.02); *H10B 12/0335* (2023.02)

(58) Field of Classification Search
CPC .............. H10B 12/482; H10B 12/0335; H10B 12/488; H10B 12/485; G11C 7/18; G11C 11/4097; H01L 21/823475
See application file for complete search history.

(56) References Cited

U.S. PATENT DOCUMENTS

| 9,184,227 | B1 | 11/2015 | Kim et al. | |
| 9,312,210 | B2 | 4/2016 | Lee et al. | |
| 10,522,362 | B2* | 12/2019 | Kim | ................ H01L 21/76897 |
| 11,121,135 | B1* | 9/2021 | Ikeda | ................ H01L 23/53266 |
| 11,594,538 | B2* | 2/2023 | Lee | ........................ H10B 12/34 |
| 2022/0093387 | A1* | 3/2022 | Lee | ................ H01L 21/02274 |

* cited by examiner

*Primary Examiner* — Shouxiang Hu
(74) *Attorney, Agent, or Firm* — IP & T GROUP LLP

(57) ABSTRACT

A semiconductor device and a method of fabricating the same are provided. According to the present invention, a semiconductor device comprises an active region formed in a substrate, and including flat surfaces and hole-shaped recess portions; upper-level plugs disposed over the flat surfaces; a spacer disposed between the upper-level plugs and providing a trench exposing the hole-shaped recess portions; a lower-level plug filling the hole-shaped recess portions; and a buried conductive line disposed over the lower-level plug and partially filling the trench.

21 Claims, 44 Drawing Sheets

SEMICONDUCTOR MEMORY DEVICE

CROSS-REFERENCE TO RELATED APPLICATIONS

The present application claims priority to Korean Patent Application No. 10-2021-0130237, filed on Sep. 30, 2021, which is incorporated herein by reference in its entirety.

BACKGROUND

1. Field

The present invention relates to a semiconductor device, and more particularly, to a semiconductor device having a buried bit line and a method for fabricating the same.

2. Description of the Related Art

As semiconductor devices are increasingly becoming more highly integrated, individual circuit patterns are becoming smaller in order to implement more semiconductor devices in the same area. That is, as the degree of integration of the semiconductor device increases, design rules for the components of the semiconductor device are decreasing. New structures and methods of manufacturing are therefore needed for maintaining or improving reliability and performance of such highly integrated semiconductor devices.

SUMMARY

Various embodiments of the present invention are directed to a semiconductor device exhibiting improved reliability and performance, and to a method for fabricating the same.

According to an embodiment of the present invention, a semiconductor device comprises an active region formed in a substrate, the active region including flat surfaces and hole-shaped recess portions; upper-level plugs disposed over the flat surfaces; a spacer disposed between the upper-level plugs, the spacer including a trench exposing the hole-shaped recess portions; a lower-level plug filling the hole-shaped recess portions; and a buried conductive line disposed over the lower-level plug and partially filling the trench.

A semiconductor device according to an embodiment of the present invention comprises an active region formed in a substrate, the active region including flat surfaces and hole-shaped recess portions; a gate trench formed in the active region between the hole-shaped recess portions and the flat surfaces; a buried word line partially filling the gate trench; upper-level plugs disposed over the flat surfaces; a spacer disposed between the upper-level plugs, the spacer including a trench exposing the hole-shaped recess portions; a lower-level plug filling the hole-shaped recess portions; and a buried bit line disposed over the lower-level plug and partially filling the trench.

A method of fabricating a semiconductor device according to an embodiment of the present invention comprises forming a device isolation layer defining a plurality of active regions in a substrate; forming a conductive layer over the device isolation layer and the active regions; etching the conductive layer, and forming conductive lines extending in a first direction and trenches between the conductive lines; forming a spacer on sidewalls of the trenches; forming hole-shaped recess portions by etching active regions disposed below the trenches so that the active regions are aligned with the spacer; forming lower-level plugs filling the hole-shaped recess portions; forming buried bit lines over the lower-level plugs; and forming upper-level plugs between the buried bit lines by etching the conductive lines along a second direction, the second direction intersecting the first direction.

A method of fabricating a semiconductor device according to an embodiment of the present invention comprises forming an active region and a device isolation layer in a substrate; forming conductive lines over the active region and trenches extending between the conductive lines; etching the active region under the trenches to form hole shaped-recess portions; filling lower-level plugs in the hole-shaped recess portions; forming buried bit lines over the lower-level plugs; and etching the conductive lines to form upper-level plugs between the buried bit lines.

Since the present invention forms a buried bit line of a damascene structure, residues and seams of bit line contact plugs can be minimized.

In addition, the present invention can form the storage node contact plugs void-free.

In addition, since the present invention forms a spacer including a low-k material between the bit line and the storage node contact plugs, it is possible to reduce parasitic capacitance.

BRIEF DESCRIPTION OF THE DRAWINGS

FIGS. 2A to 18A are cross-sectional views illustrating a fabrication method taken along line A-A' of FIG. 1A.

FIGS. 2B to 18B are cross-sectional views illustrating a fabrication method taken along line B-B' of FIG. 1A.

DETAILED DESCRIPTION

Figure 1A:
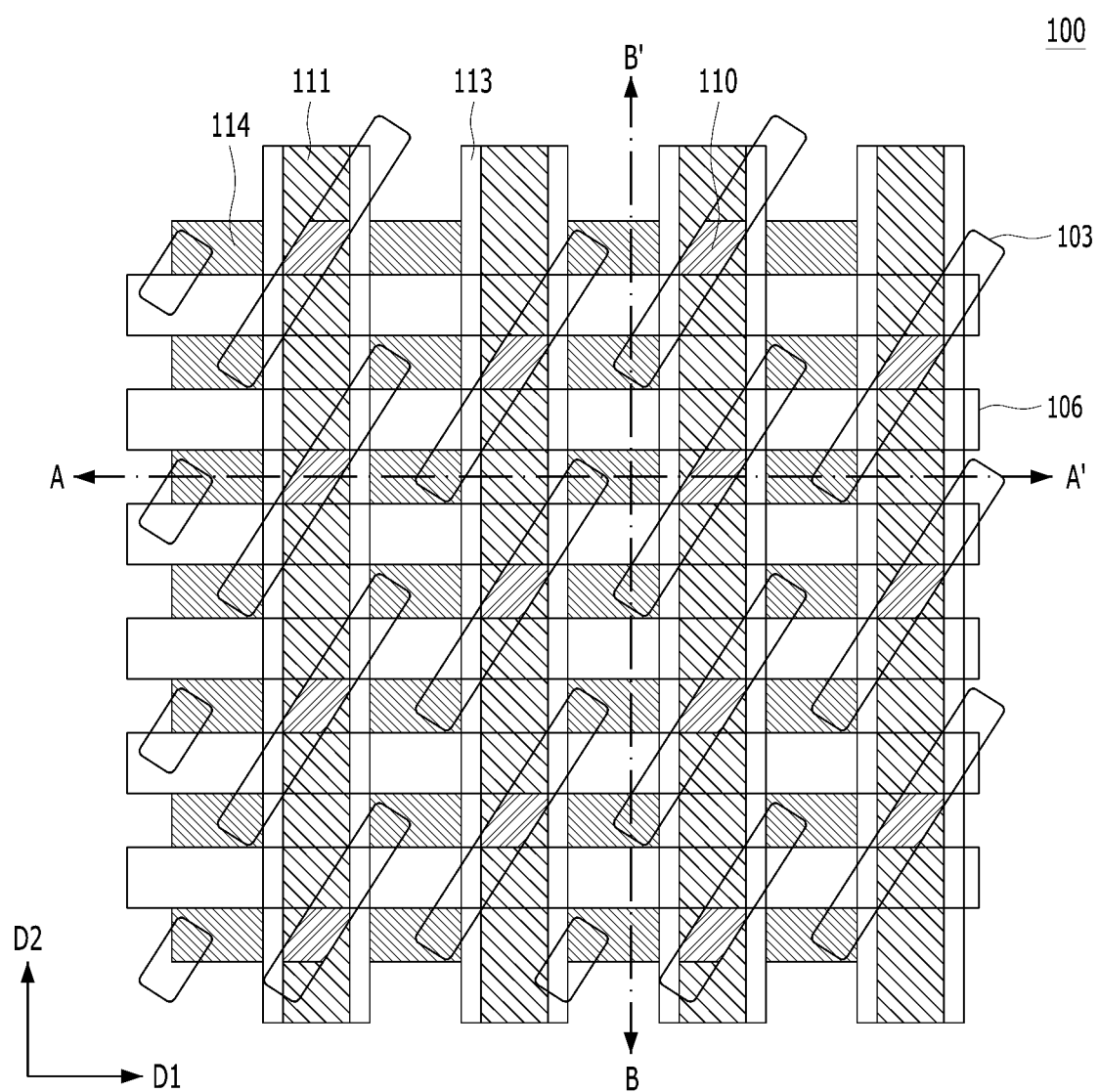
FIG. 1A is a schematic plan view of a semiconductor device according to an embodiment of the present invention.

Various embodiments described herein will be described with reference to cross-sectional views, plan views and block diagrams, which are schematic views of the present invention. Therefore, the structures of the drawings may be modified by fabricating technology and/or tolerances. Various embodiments of the present invention are not limited to the specific structures shown in the drawings, but include any changes in the structures that may be produced according to the fabricating process. Also, any regions and shapes of regions illustrated in the drawings have schematic views, are intended to illustrate specific examples of structures of regions of the various elements, and are not intended to limit the scope of the invention.

Figure 1B:
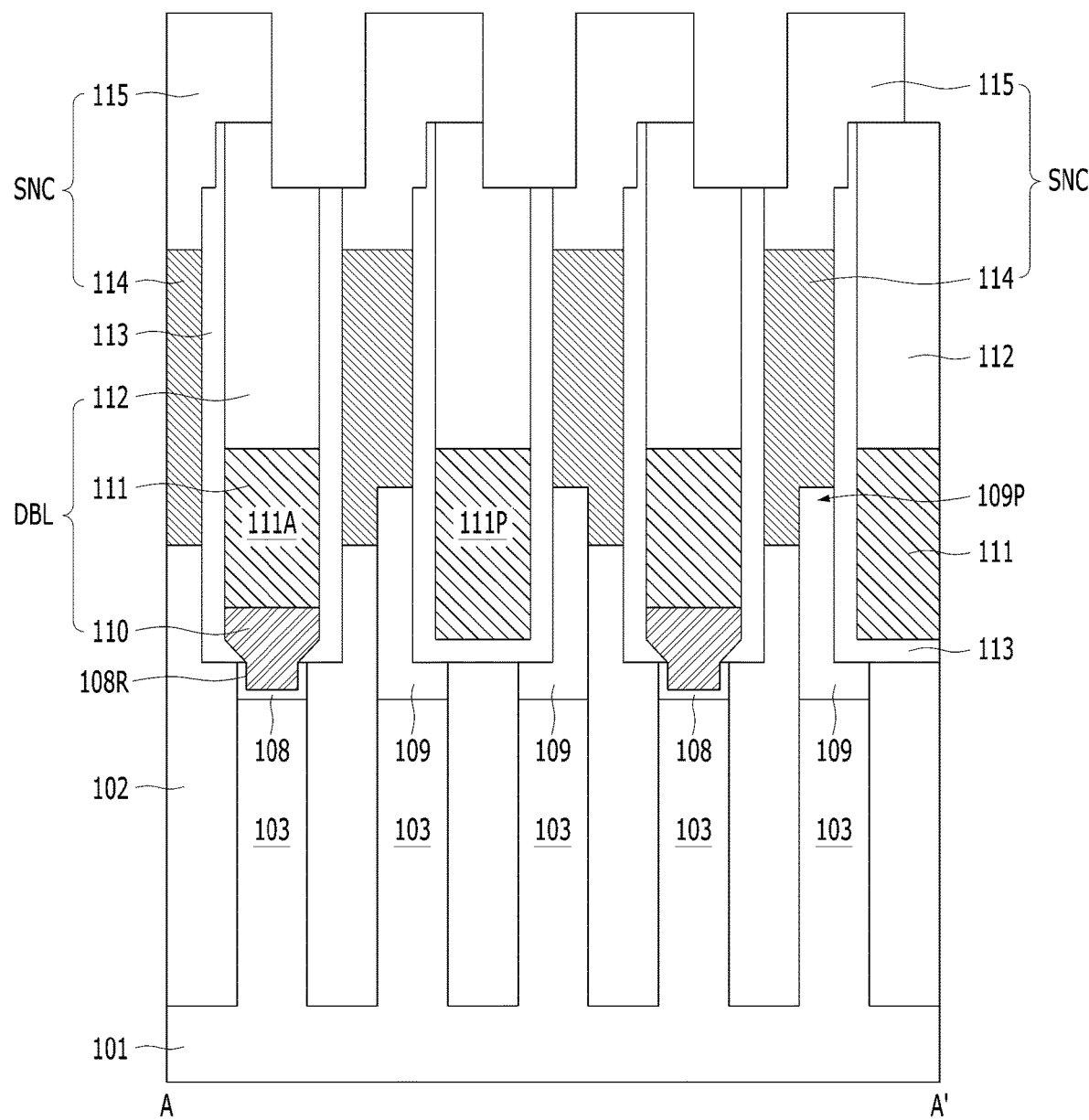
FIG. 1B is a detailed cross-sectional view taken along line A-A' of FIG. 1A.
Figure 1C:
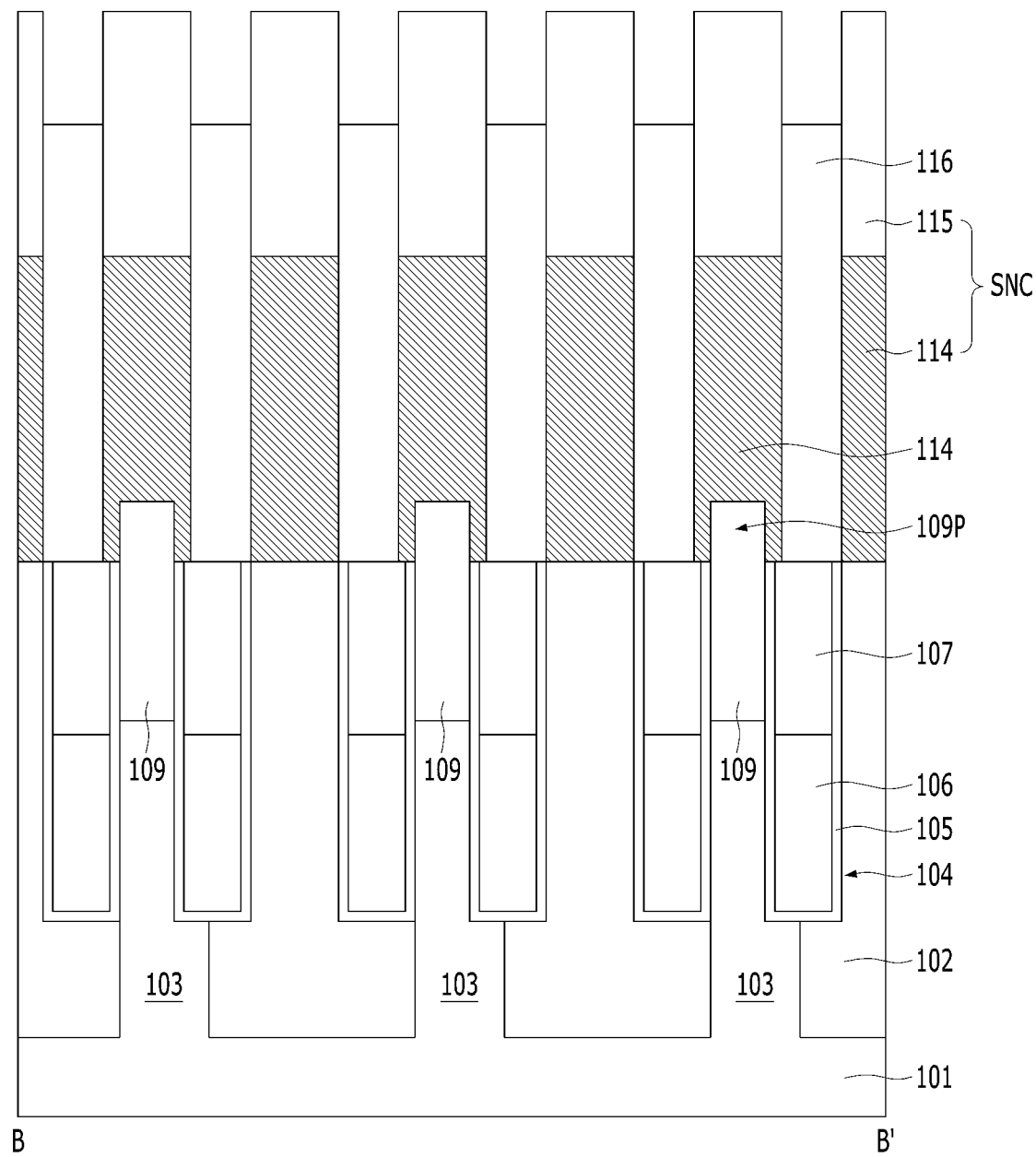
FIG. 1C is a detailed cross-sectional view taken along line B-B' of FIG. 1A.

FIG. 1A is a schematic plan view of a semiconductor device according to an embodiment of the present invention. FIG. 1B is a detailed cross-sectional view taken along line A-A' of FIG. 1A. FIG. 1C is a detailed cross-sectional view taken along line B-B' of FIG. 1A.

Referring to FIGS. 1A to 1C, the semiconductor device 100 may include a first buried conductive line 106 and a second buried conductive line 111.

The semiconductor device 100 will be described in detail.

A device isolation layer 102 and an active region 103 may be formed in the substrate 101. A plurality of active regions 103 may be defined by the device isolation layers 102. The substrate 101 may be a material suitable for semiconductor processing. The substrate 101 may include a semiconductor substrate. The substrate 101 may be made of a material containing silicon. The substrate 101 may include silicon, monocrystalline silicon, polysilicon, amorphous silicon, silicon germanium, monocrystalline silicon germanium, polycrystalline silicon germanium, carbon doped silicon, a combination thereof, or multiple layers thereof. The substrate 101 may include other semiconductor materials such as germanium. The substrate 101 may include a III/V group semiconductor substrate, for example, a compound semiconductor substrate such as GaAs. The substrate 101 may include a silicon on insulator (SOI) substrate. The device isolation layer 102 may be formed by a shallow trench isolation (STI) process.

A gate trench 104 crossing the device isolation layer 102 and the active region 103 may be formed in the substrate 101. A gate dielectric layer 105 is formed on the surface of the gate trench 104. A first buried conductive line 106 partially filling the gate trench 104 may be formed on the gate dielectric layer 105. A buried capping layer 107 may be formed on the first buried conductive line 106. The upper surface of the first buried conductive line 106 may be at a level lower than the surface of the substrate 101, that is, the upper surface of the active region 103. The first buried conductive line 106 may be made of a low-resistivity metal material. Titanium nitride and tungsten may be sequentially stacked on the first buried conductive line 106. In another embodiment, the first buried conductive line 106 may be formed of titanium nitride only (TiN only). The first buried conductive line 106 may be referred to as a 'buried gate electrode' or a 'buried word line'. The first buried conductive line 106 may extend in a first direction D1.

First and second impurity regions 108 and 109 may be formed on the substrate 101. The first and second impurity regions 108 and 109 may be spaced apart from each other by the gate trench 104. The first and second impurity regions 108 and 109 may be referred to as source/drain regions. The first and second impurity regions 108 and 109 may include N-type impurities such as arsenic (As) or phosphorus (P). Accordingly, the first buried conductive line 106 and the first and second impurity regions 108 and 109 may become cell transistors. The cell transistor may improve the short channel effect by the first buried conductive line 106. The first impurity region 108 may be positioned at a level lower than the upper surface of the active region 103. The first impurity region 108 may be shallower than the second impurity region 109.

A lower-level plug 110 may be formed over the substrate 101. The lower-level plug 110 may be connected to the first impurity region 108. A lower surface of the lower-level plug 110 may be at a lower level than upper surfaces of the device isolation layer 102 and the active region 103. The lower-level plug 110 may be embedded in the substrate 101. The lower-level plug 110 may include an epitaxial silicon layer. A second buried conductive line 111 may be formed on the lower-level plug 110. A buried hard mask 112 may be formed on the second buried conductive line 111. The stacked structure of the lower-level plug 110, the second buried conductive line 111, and the buried hard mask 112 may be referred to as a damascene structure DBL. The second buried conductive line 111 may extend along the second direction D2 crossing the first buried conductive lines 106. A portion of the second buried conductive line 111 may be connected to the lower-level plug 110. The second buried conductive line 111 may include a metal material such as tungsten. The buried hard mask 112 may include a dielectric material such as silicon nitride.

A spacer 113 may be formed on a sidewall of the damascene structure DBL. The spacer 113 may be extended on and parallel to both sidewalls of the damascene structure DBL. The spacer 113 may include a dielectric layer or a stack of different dielectric layers. For example, the spacer 113 may include an oxide, a nitride, a low-k material, or a combination thereof. The spacer 113 may include nitride and a low-k material over the nitride. The low-k material may include SiCO, SiCN, SiOCN, SiBN or SiBCN. The spacer 113 may include NKOK, NKN, NKON, NK, NO or KO, where K may refer to a low-k material, N may refer to a nitride, and O may refer to an oxide. In another embodiment, the spacer 113 may include an air gap. For example, the spacer 113 may have an N-A-N structure in which an air gap is positioned between nitrides.

A vertical plug SNC may be formed between adjacent damascene structures DBL. The vertical plug SNC may be connected to the second impurity region 109. The vertical plug SNC may include an upper-level plug 114 and a top-level plug 115. The vertical plug SNC may further include an ohmic contact layer (not shown) between the upper-level plug 114 and the top-level plug 115. The ohmic contact layer may include metal silicide. For example, the upper-level plug 114 may include polysilicon, and the top-level plug 115 may include a metal nitride, a metal material, or a combination thereof.

When viewed in a direction parallel to the damascene structure DBL, the plug isolation layer 116 may be formed between the neighboring vertical plugs SNC. The plug isolation layer 116 may be formed between neighboring damascene structures DBL. The neighboring vertical plugs SNC may be spaced apart by the plug isolation layer 116. The plurality of plug isolation layers 116 and the plurality of vertical plugs SNC may be alternately disposed between neighboring damascene structures DBL.

A memory element (not shown) may be formed on the top-level plug 115. The memory element may include a capacitor including a storage node. The storage node may include a pillar type. Although not shown, a dielectric layer and a plate node may be further formed on the storage node. The storage node may be a cylinder type as well as a pillar type.

The damascene structure DBL may be referred to as a damascene bit line structure, and the vertical plug SNC may be referred to as a storage node contact plug. The lower-level plug 110 may be referred to as a bit line contact plug, and the second buried conductive line 111 may be referred to as a bit line. The buried hard mask 114 may be referred to as a bit line hard mask.

A trench extending in the second direction D2 may be defined by the spacers 113 disposed between the upper-level plugs 114 arranged in the first direction D1. The damascene structure DBL extending in the second direction D2 may be buried in the trench. The second buried conductive line 111 may include an active conductive line 111A contacting the lower-level plug 110 and a passing conductive line 111P extending from the active conductive line 111A. The spacer 113 may extend along sidewalls and a bottom surface of the passing conductive line 111P. The spacer 113 may extend along sidewalls of the active conductive line 111A and surround sidewalls of the lower-level plug 110. Active conductive lines 111A and passing conductive lines 111P may be alternately disposed along the A-A' direction.

The bottom surface of the passing conductive line 111P of the second buried conductive line 111 may be at a higher level than the bottom surface of the lower-level plug 110. The bottom surface of the active conductive line 111A of the second buried conductive line 111 may be at a higher level than the bottom surface of the spacer 113. The bottom surface of the spacer 113 may be at a higher level than the bottom surface of the lower-level plug 110. The bottom surface of the spacer 113 may be at a lower level than the top surface of the upper-level plug 114.

The active region 103 may be formed in the substrate 101, and may include a hole-shaped recess portion 108R and protrusions 109P. A flat surface may be provided between the hole-shaped recess portion 108R and the protrusions 109P. The flat surface may refer to the upper surface of the device isolation layer 102. The upper surface of the hole-shaped recess portion 108R may be located at a lower horizontal level than the flat surface, and the upper surface of the protrusions 109P may be located at a higher horizontal level than the flat surface. The upper surface of the hole-shaped recess portion 108R may be located at a lower horizontal level than the upper surface of the device isolation layer 102, and the upper surface of the protrusions 109P may be located at a higher horizontal level than the upper surface of the device isolation layer 102. The upper surface of the hole-shaped recess portion 108R may be located at a lower horizontal level than the upper surface of the buried capping layer 107, and the upper surface of the protrusion 109P may be located at a higher horizontal level than the upper surface of the buried capping layer 107. The upper surface of the device isolation layer 102 and the upper surface of the buried capping layer 107 may be located at the same horizontal level. The upper surface of the protrusions 109P may also include a flat surface. The flat surface of the protrusions 109P may be located at a higher horizontal level than the upper surface of the device isolation layer 102.

The active region 103 may include first impurity regions 108 and second impurity regions 109. An upper surface of the first impurity regions 108 may be located at a lower horizontal level than a top surface of the device isolation layer 102, and an upper surface of the second impurity regions 109 may be located at a higher horizontal level than an upper surface of the device isolation layer 102. Upper surfaces of the first impurity regions 108 may be positioned at a lower horizontal level than upper surfaces of the second impurity regions 109. Bottom surfaces of the first impurity regions 108 and bottom surfaces of the second impurity regions 109 may be positioned at the same horizontal level. In another embodiment, bottom surfaces of the first impurity regions 108 may be positioned at a lower horizontal level than bottom surfaces of the second impurity regions 109. The height (or depth) of the first impurity regions 108 may be smaller than the height (or depth) of the second impurity regions 109.

Each of the first impurity regions 108 may include a hole-shaped recess portion 108R, and the lower-level plug 110 may contact the hole-shaped recess portion 108R of the first impurity region 108. The contact area between the lower-level plug 110 and the first impurity region 108 may be increased by the hole-shaped recess portion 108R.

Each of the second impurity regions 109 may include a protrusion 109P, and the upper-level plug 114 may cover the protrusions 109P. For example, the upper-level plug 114 may contact the upper surface and sidewalls of the protrusion 109P. The contact area between the upper-level plug 114 and the second impurity region 109 may be increased by the protrusion 109P.

The upper-level plug 114 may extend to the upper surface of the device isolation layer 102 while contacting the protrusion 109P of the second impurity region 109. The bottom surfaces of the upper-level plugs 114 may contact the protrusions 109P and the device isolation layer 102 at the same time. A step may be formed between the protrusions 109P and the device isolation layer 102.

In the lower-level plug 110, a portion in contact with the first buried conductive line 111 may have a greater line width than a portion filling the hole-shaped recess portion 108R.

The lower-level plug 110 and the upper-level plug 114 may include an epitaxial silicon layer.

FIGS. 2A to 18B are diagrams illustrating an embodiment of a method of fabricating a semiconductor device. FIGS. 2A to 18A are cross-sectional views illustrating a fabrication method taken along line A-A' of FIG. 1A, and FIGS. 2B to 18B are cross-sectional views illustrating a fabrication method taken along line B-B' of FIG. 1A. The fabrication methods based on the line A-A' and the line B-B' may be performed simultaneously. FIGS. 19A to 19E are plan views illustrating a fabrication method taken along the lines A-A' and B-B' of FIG. 1A.

Figure 2A:
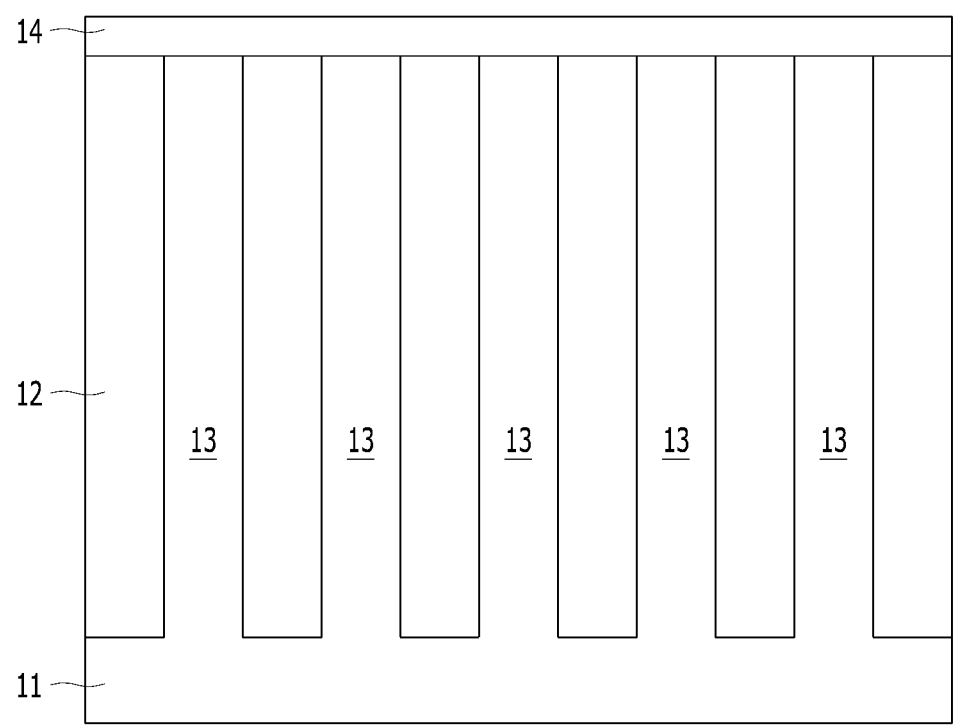
Figure 2B:
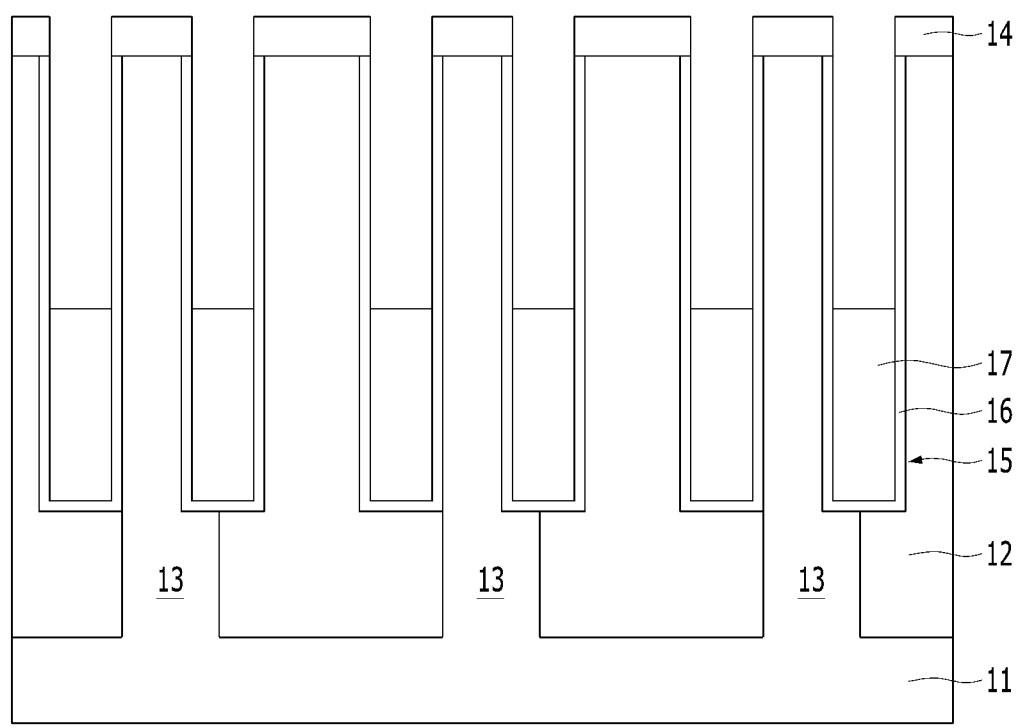

As shown in FIGS. 2A and 2B, a device isolation layer 12 may be formed in a substrate 11. A plurality of active regions 13 are defined by the device isolation layers 12. The device isolation layer 12 may be formed by a shallow trench isolation (STI) process. The STI process is as follows. The substrate 11 is etched to form an isolation trench (reference numeral omitted). The isolation trench is filled with a dielectric material, and thus the device isolation layer 12 is formed. The device isolation layer 12 may include silicon oxide, silicon nitride, or a combination thereof. Chemical vapor deposition (CVD) process or other deposition processes may be used to fill the isolation trench with a dielectric material. A planarization process such as chemical-mechanical polishing (CMP) may additionally be used.

Next, a gate trench 15 in the substrate 11, a gate dielectric layer 16 covering the bottom surface and sidewalls of the gate trench 15, and buried word line partially filling the gate trench 15 on the gate dielectric layer 16 may be sequentially formed.

First, a gate trench 15 may be formed in the substrate 11. The gate trench 15 may have a line shape crossing the active regions 13 and the device isolation layer 12. The gate trench 15 may be formed by forming the hard mask layer 14 on the substrate 11 and by performing an etching process using the hard mask layer 14 as an etch barrier. The hard mask layer 14 may include silicon oxide. The hard mask layer 14 may include tetra ethyl ortho silicate (TEOS). The bottom surface of the gate trench 15 may be located at a higher level than the bottom surface of the device isolation layer 12.

Although not shown, a portion of the device isolation layer 12 may be recessed to protrude the active region 13 under the gate trench 15. Accordingly, a fin region (reference numeral omitted) may be formed under the gate trench 15. The fin region may be a part of the channel region.

Next, a gate dielectric layer 16 may be formed on the bottom surface and sidewalls of the gate trench 15. Before forming the gate dielectric layer 16, any etch damage on the surface of the gate trench 15 may be cured. For example, after the sacrificial oxide is formed on the surface of the gate trench 15 by thermal oxidation, the sacrificial oxide may be removed.

The gate dielectric layer 16 may be formed by a thermal oxidation process. For example, the gate dielectric layer 16 may be formed by oxidizing the bottom and sidewalls of the gate trench 15.

In another embodiment, the gate dielectric layer 16 may be formed by a deposition method such as chemical vapor deposition (CVD) or atomic layer deposition (ALD). The gate dielectric layer 16 may include a high-k material, oxide, nitride, oxynitride, or a combination thereof. The high-k material may include a hafnium-containing material. The hafnium-containing material may include hafnium oxide, hafnium silicon oxide, hafnium silicon oxynitride, or a combination thereof. In another embodiment, the high-k material may include lanthanum oxide, lanthanum aluminum oxide, zirconium oxide, zirconium silicon oxide, zirconium silicon oxynitride, aluminum oxide, and a combination thereof.

In another embodiment, the gate dielectric layer 16 may be formed by depositing a liner polysilicon layer and then radically oxidizing the liner polysilicon layer.

In yet another embodiment, the gate dielectric layer 16 may be formed by forming a liner silicon nitride layer and then radically oxidizing the liner silicon nitride layer after.

Next, a buried word line 17 may be formed on the gate dielectric layer 16. To form the buried word line 17, a recessing process may be performed after a conductive layer (not shown) is formed to fill the gate trench 15. The recessing process may include performing an etch back process or sequentially performing a chemical mechanical polishing (CMP) process and an etch back process. The buried word line 17 may have a recessed shape partially filling the gate trench 15. That is, the upper surface of the buried word line 17 may be at a lower level than the upper surface of the active region 13. The buried word line 17 may include a metal, a metal nitride, or a combination thereof. For example, the buried word line 17 may be formed of titanium nitride (TIN), tungsten (W), or titanium nitride/tungsten (TiN/W) stack. The titanium nitride/tungsten (TiN/W) stack may have a structure in which titanium nitride is conformally formed and then the gate trench 15 is partially filled with tungsten. As the buried word line 17, titanium nitride may be used alone, and this may be referred to as the buried word line 17 having a "TiN Only" structure. A double gate structure of a titanium nitride/tungsten (TiN/W) stack and a polysilicon layer may be used as the buried word line 17. The buried word line 17 may correspond to the first buried conductive line 106 as referenced in FIGS. 1A to 1C.

Figure 3A:
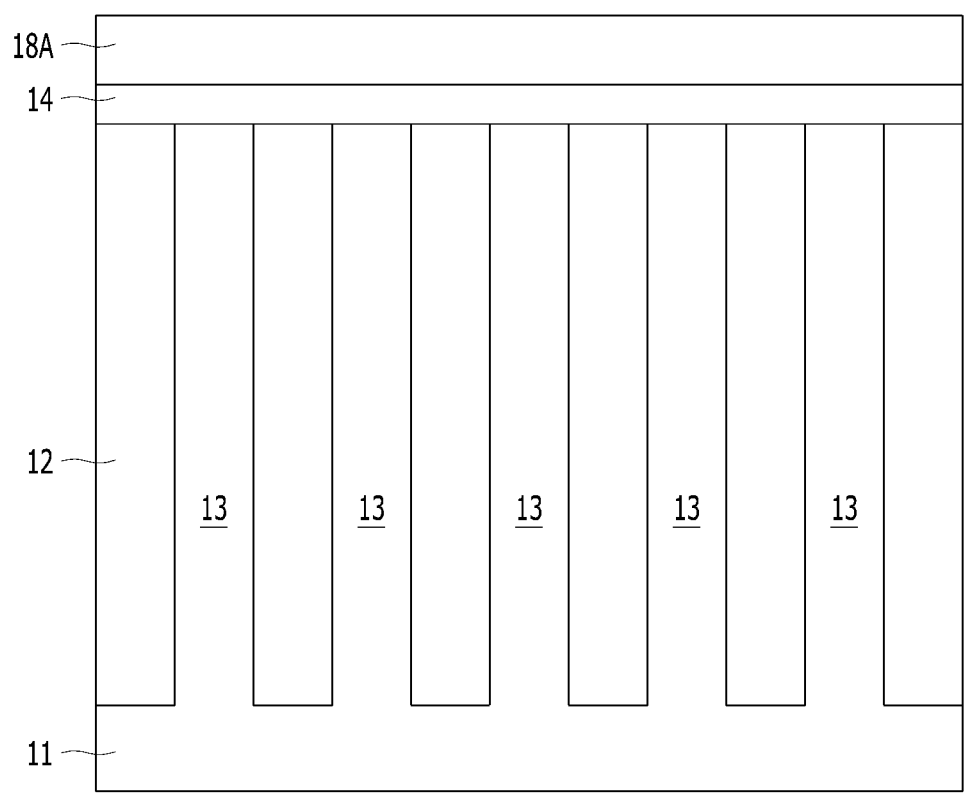
Figure 3B:
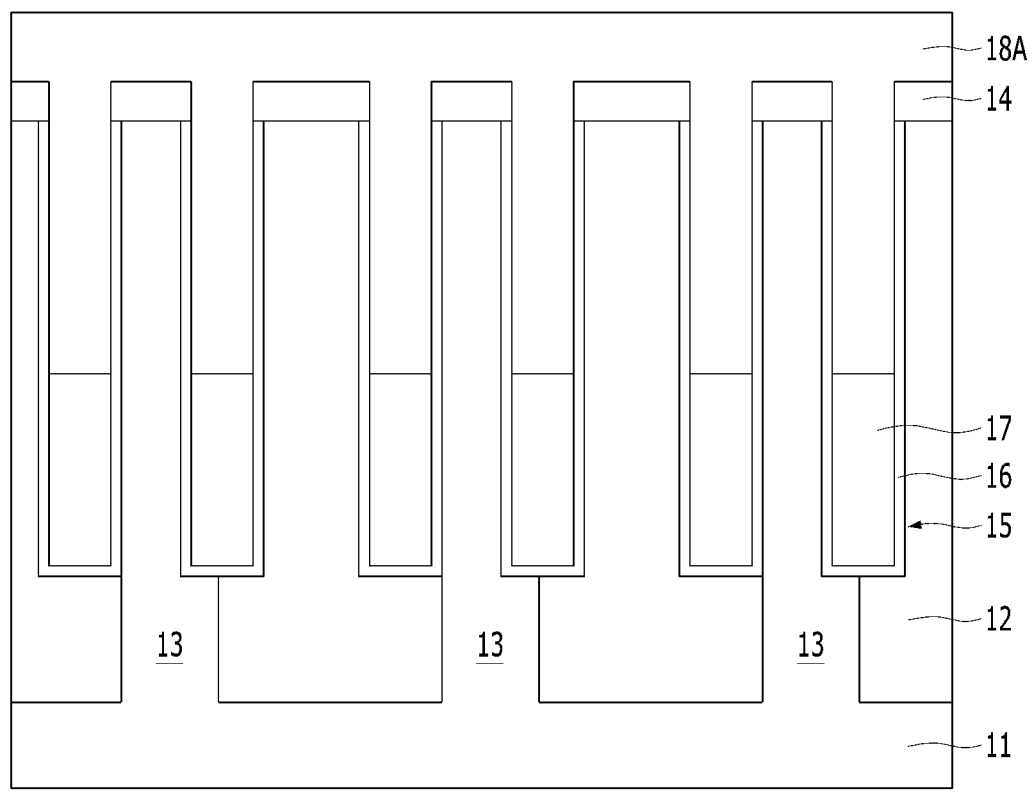

As shown in FIGS. 3A and 3B, a gate capping material 18A may be formed on the buried word line 17. The gate capping material 18A may include a dielectric material. The remaining portion of the gate trench 15 on the buried word line 17 is filled with a gate capping material 18A. The gate capping material 18A may include silicon nitride. In another embodiment, the gate capping material 18A may include silicon oxide. In another embodiment, the gate capping material 18A may have a Nitride-Oxide-Nitride (NON) structure. The gate capping material 18A may cover the upper surface of the hard mask layer 14.

Figure 4A:
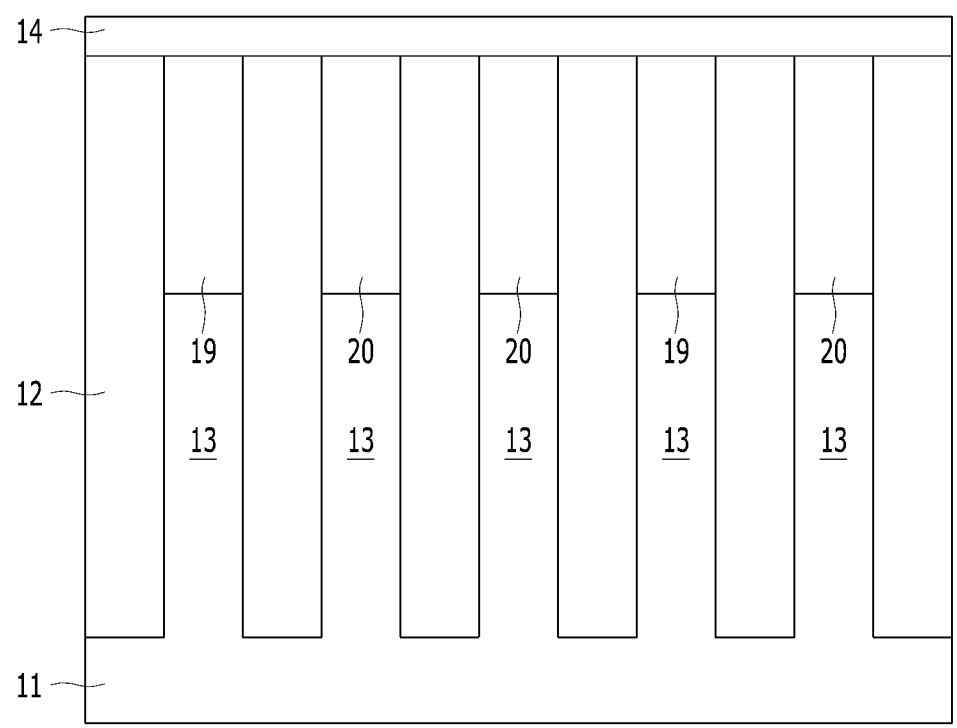
Figure 4B:
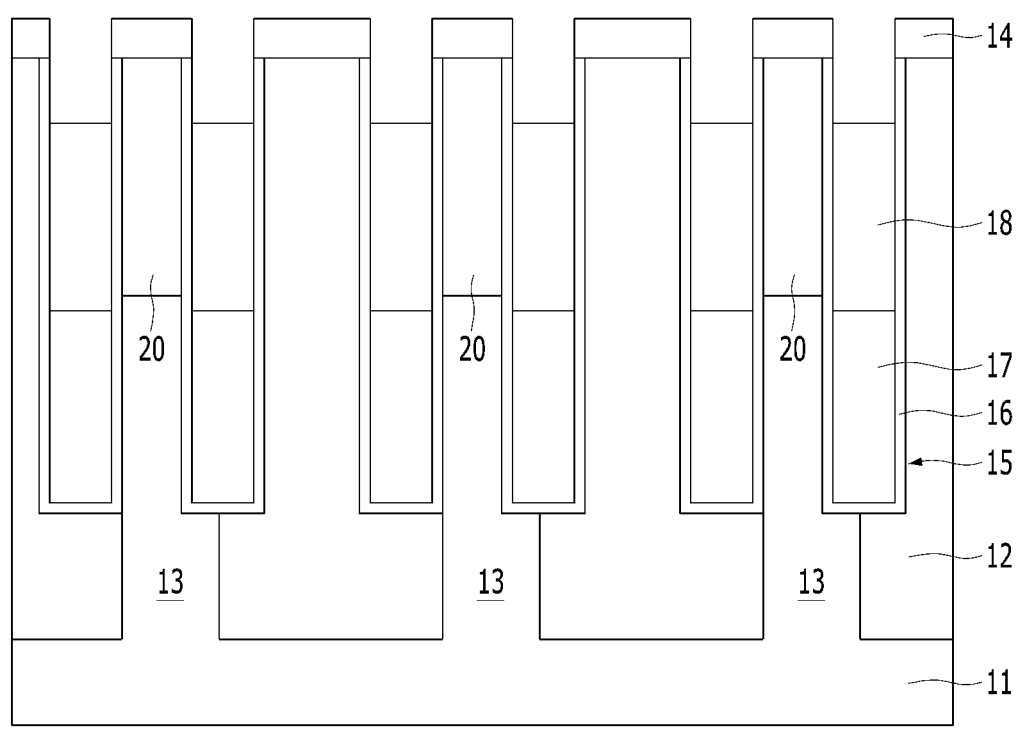

As shown in FIGS. 4A and 4B, a buried capping layer 18 may be formed. The buried capping layer 18 may partially fill the remaining portion of the gate trench 15 on the buried word line 17. In order to form the buried capping layer 18, an etch back process of the gate capping material 18A may be performed. The upper surface of the buried capping layer 18 may be at a lower level than the upper surface of the hard mask layer 14, and may also be at a lower level than the upper surface of the active region 13.

After the formation of the buried capping layer 18, impurity regions 19 and 20 may be formed. The impurity regions 19 and 20 may be formed by a doping process such as implantation. The impurity regions 19 and 20 may include a first impurity region 19 and a second impurity region 20. The first and second impurity regions 19 and 20 may be doped with impurities of the same conductivity type. The first and second impurity regions 19 and 20 may have the same depth. In another embodiment, the first impurity region 19 may be deeper than the second impurity region 20. The first and second impurity regions 19 and 20 may be referred to as source/drain regions. The first impurity region 19 may be a region to which a lower-level plug is to be connected, and the second impurity region 20 may be a region to which a storage node contact plug is to be connected. The first impurity region 19 and the second impurity region 20 may be disposed in different active regions 13. Also, the first impurity region 19 and the second impurity region 20 may be spaced apart from each other by the gate trenches 15 and disposed in each of the active regions 13.

A cell transistor of the memory cell may be formed by the buried word line 17 and the first and second impurity regions 19 and 20.

Figure 5A:
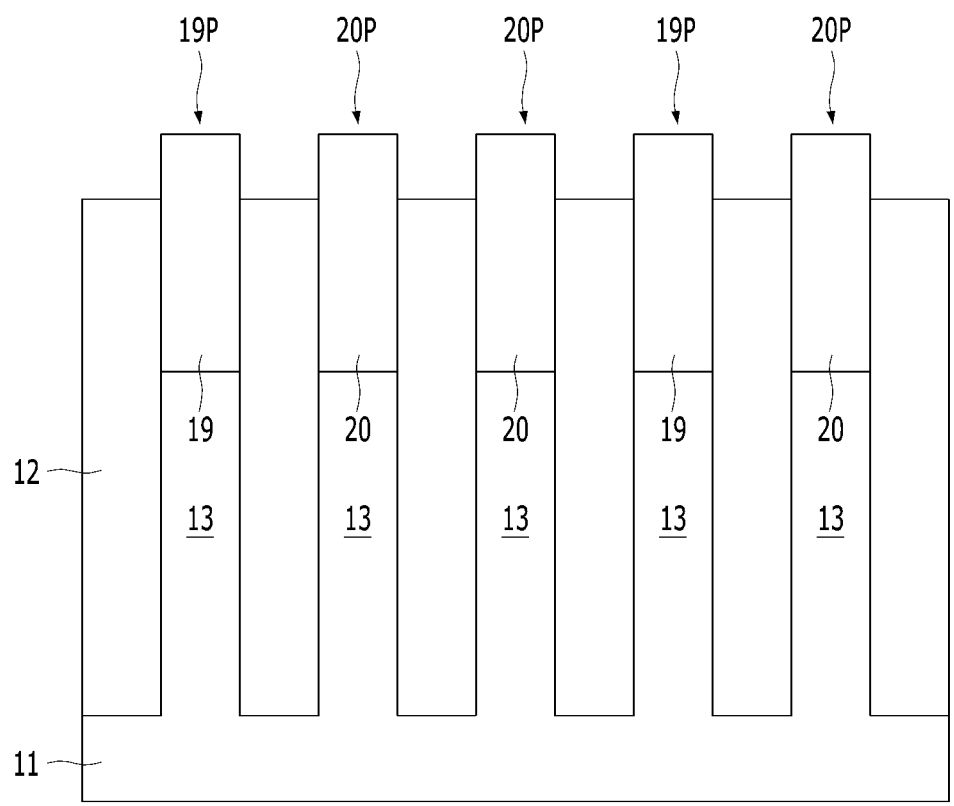
Figure 5B:
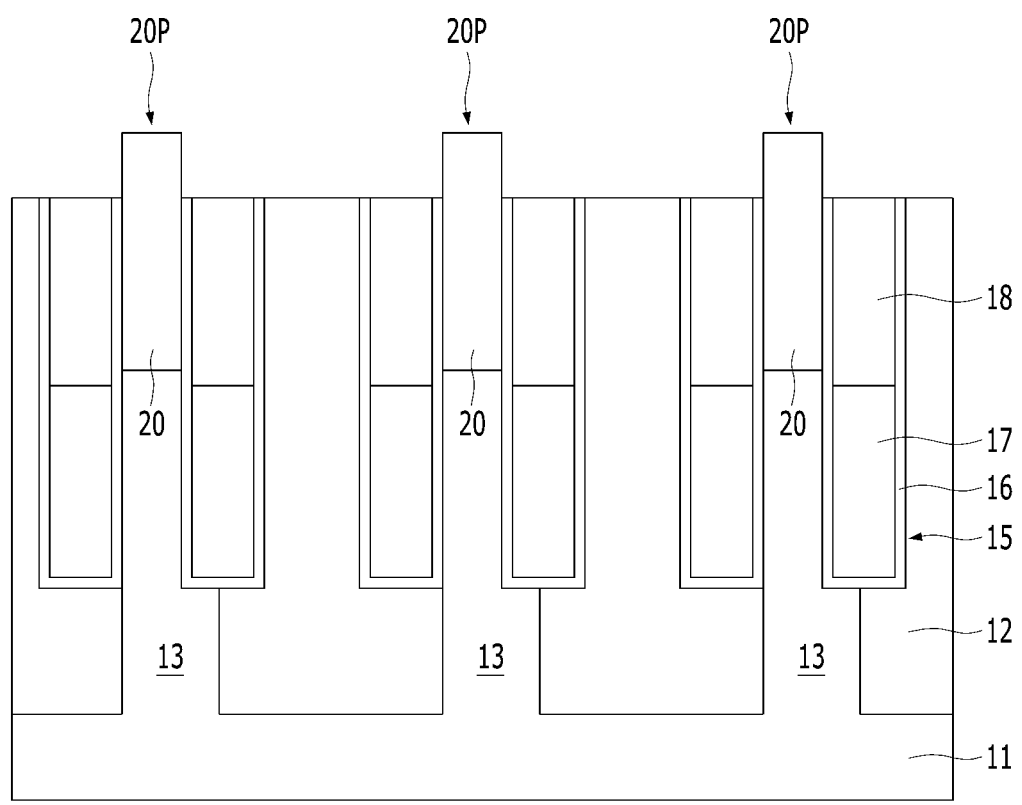

As shown in FIGS. 5A and 5B, after the hard mask layer 14 is removed, a portion of the gate dielectric layer 16 and a portion of the device isolation layer 12 may be recessed. After the recessing process, the upper surface of the gate dielectric layer 16 and the upper surface of the device isolation layer 12 may be at the same level as the upper surface of the buried capping layer 18.

As described above, a portion of the active region 13 may protrude by recessing a portion of the gate dielectric layer 16 and a portion of the device isolation layer 12. For example, upper regions 19P of the first impurity regions 19 and upper regions 20P of the second impurity regions 20 may protrude. Hereinafter, upper regions of the first impurity regions 19 are abbreviated as first protrusions 19P, and upper regions of the second impurity regions 20 are abbreviated as second protrusions 20P. Upper surfaces of the first protrusions 19P and upper surfaces of the second protrusions 20P may be at the same level. Upper surfaces of the first protrusions 19P and upper surfaces of the second protrusions 20P may be at a higher level than upper surfaces of the gate dielectric layer 16 and upper surfaces of the device isolation layer 12. Sidewalls of the first protrusions 19P and sidewalls of the second protrusions 20P may be non-covered by the gate dielectric layer 16 and the device isolation layer 12.

The second impurity regions 20 have an elevated source/drain structure by the second protrusions 20P, and accordingly, the depth of the buried word line 17 and the depth of the device isolation layer 12 may be reduced.

Figure 6A:
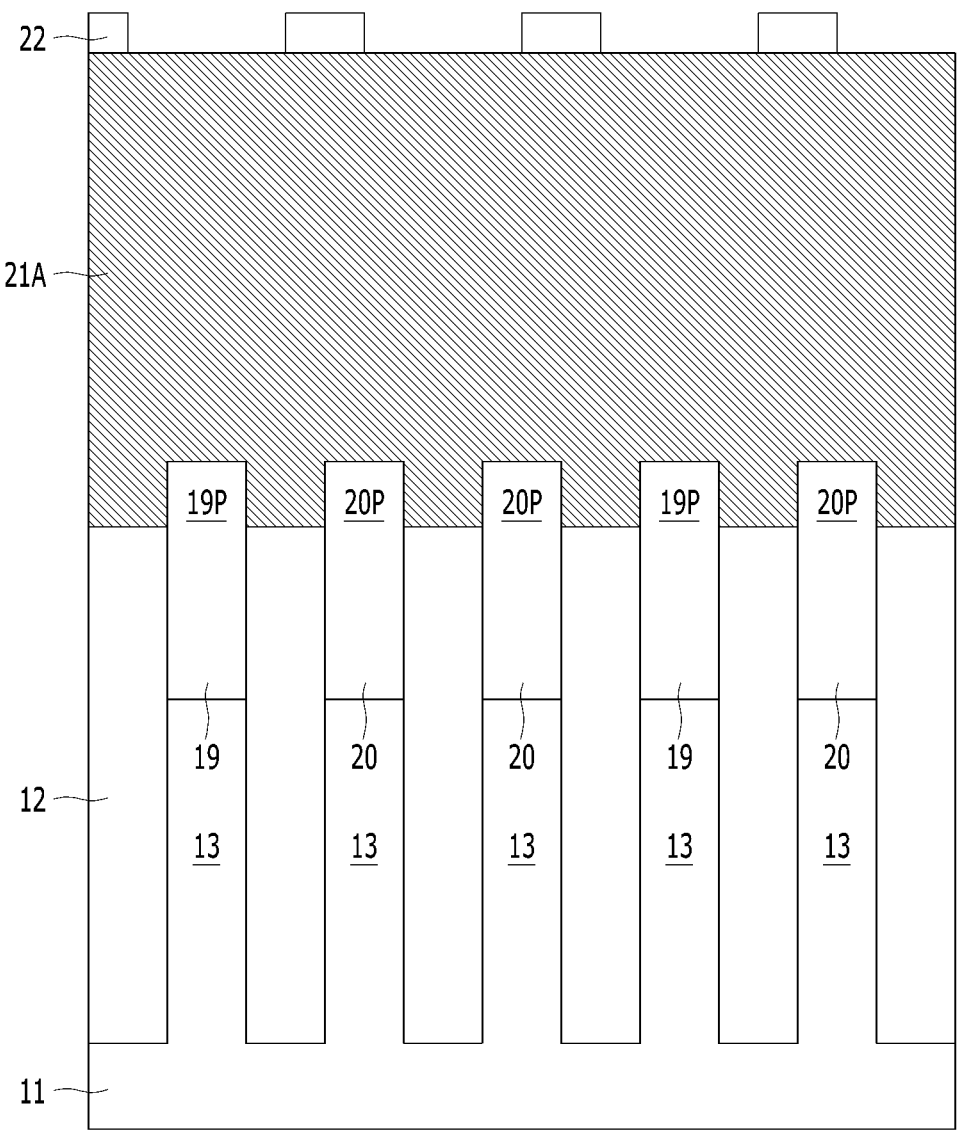
Figure 6B:
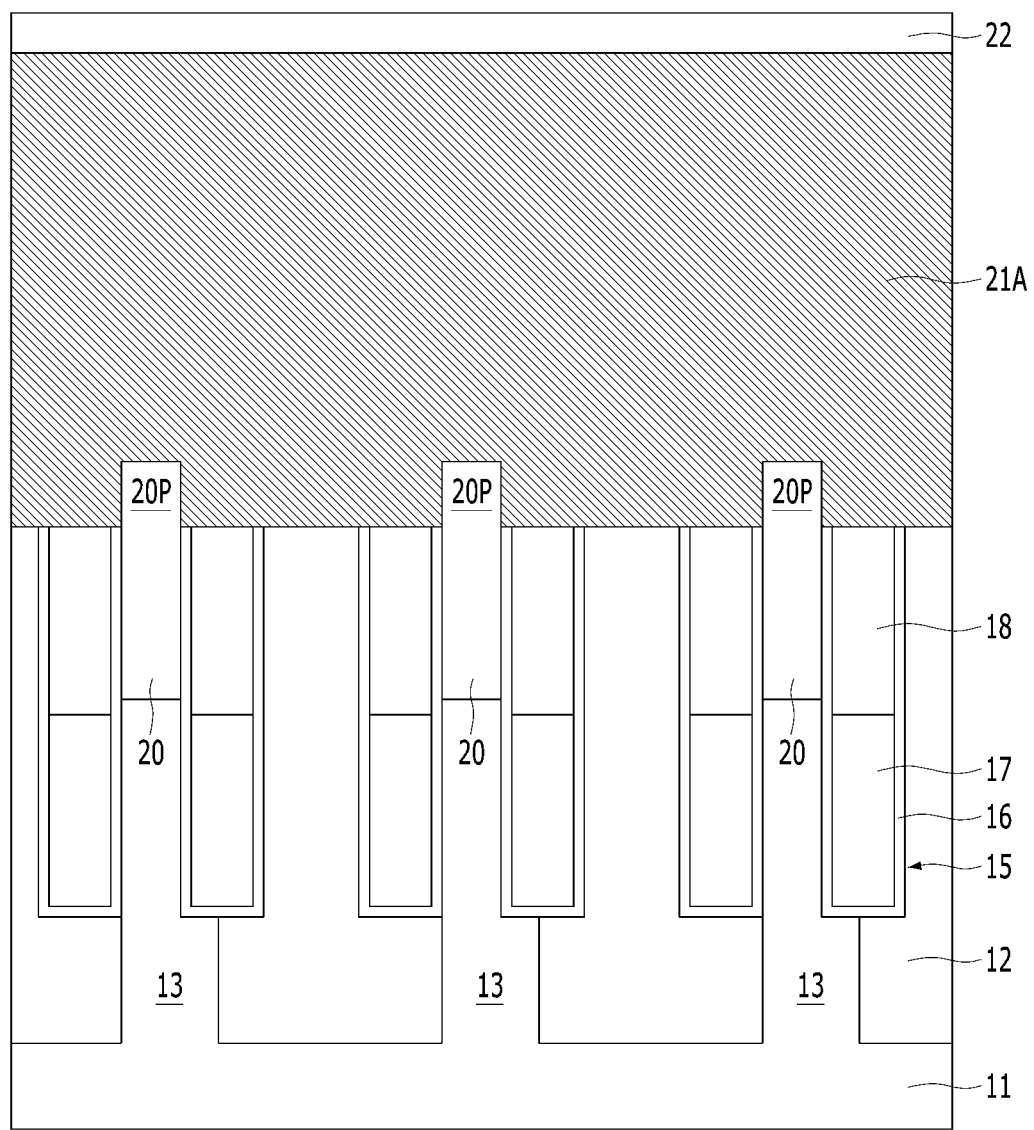

As shown in FIGS. 6A and 6B, an initial conductive layer 21A may be formed. The initial conductive layer 21A may be formed by a chemical vapor deposition (CVD) process. In addition, the initial conductive layer 21A may be formed through selective epitaxial growth (SEG). The initial conductive layer 21A may include an epitaxial silicon layer or an epitaxial polysilicon layer. The initial conductive layer 21A may be selectively grown from the surface of the first protrusions 19P and from the surface of the second protrusions 20P. The initial conductive layer 21A may cover all of the gate dielectric layer 16, the device isolation layer 12, and the buried capping layer 18.

Next, a first mask layer 22 may be formed on the initial conductive layer 21A. When viewed from top, the first mask layer 22 may have a line shape extending in either direction. The first mask layer 22 may include a photoresist pattern or a hard mask material.

Figure 7A:
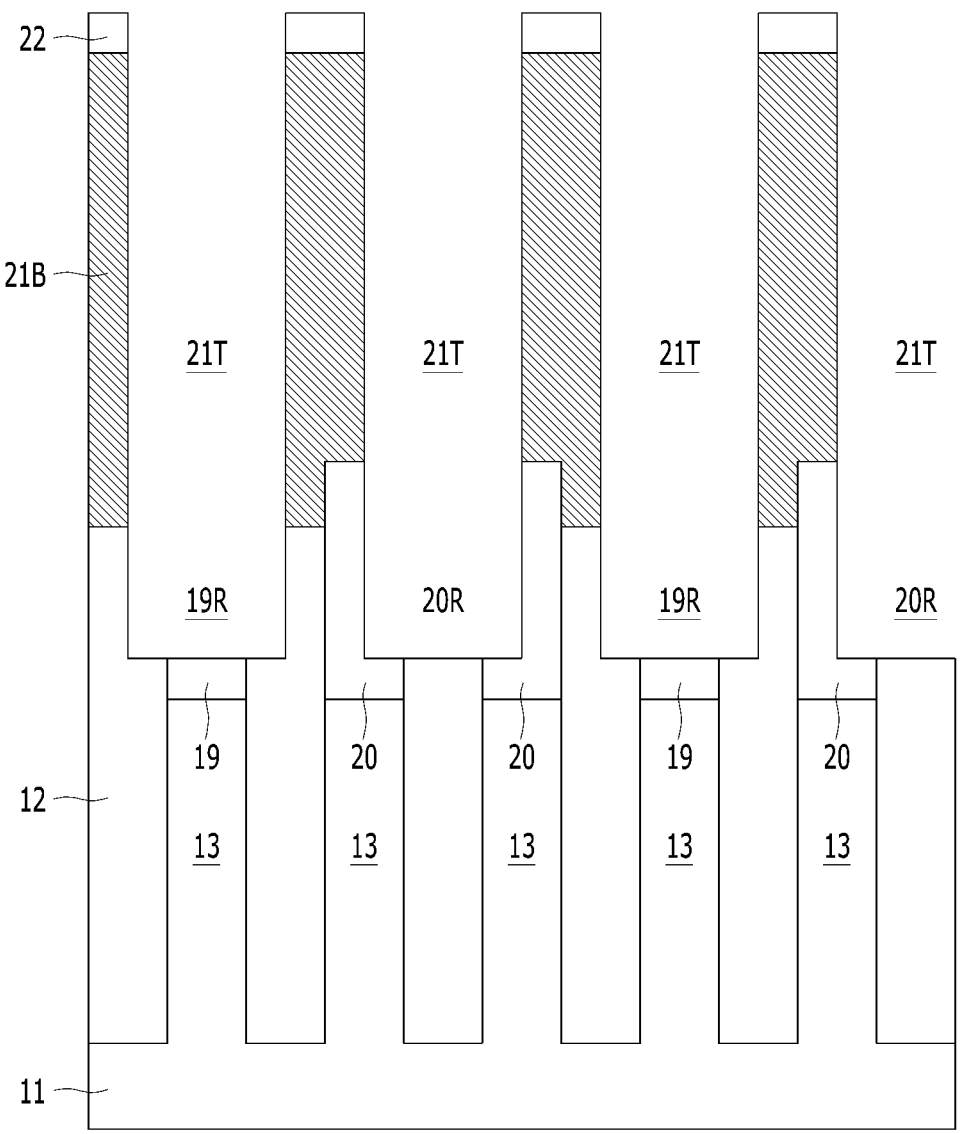
Figure 7B:
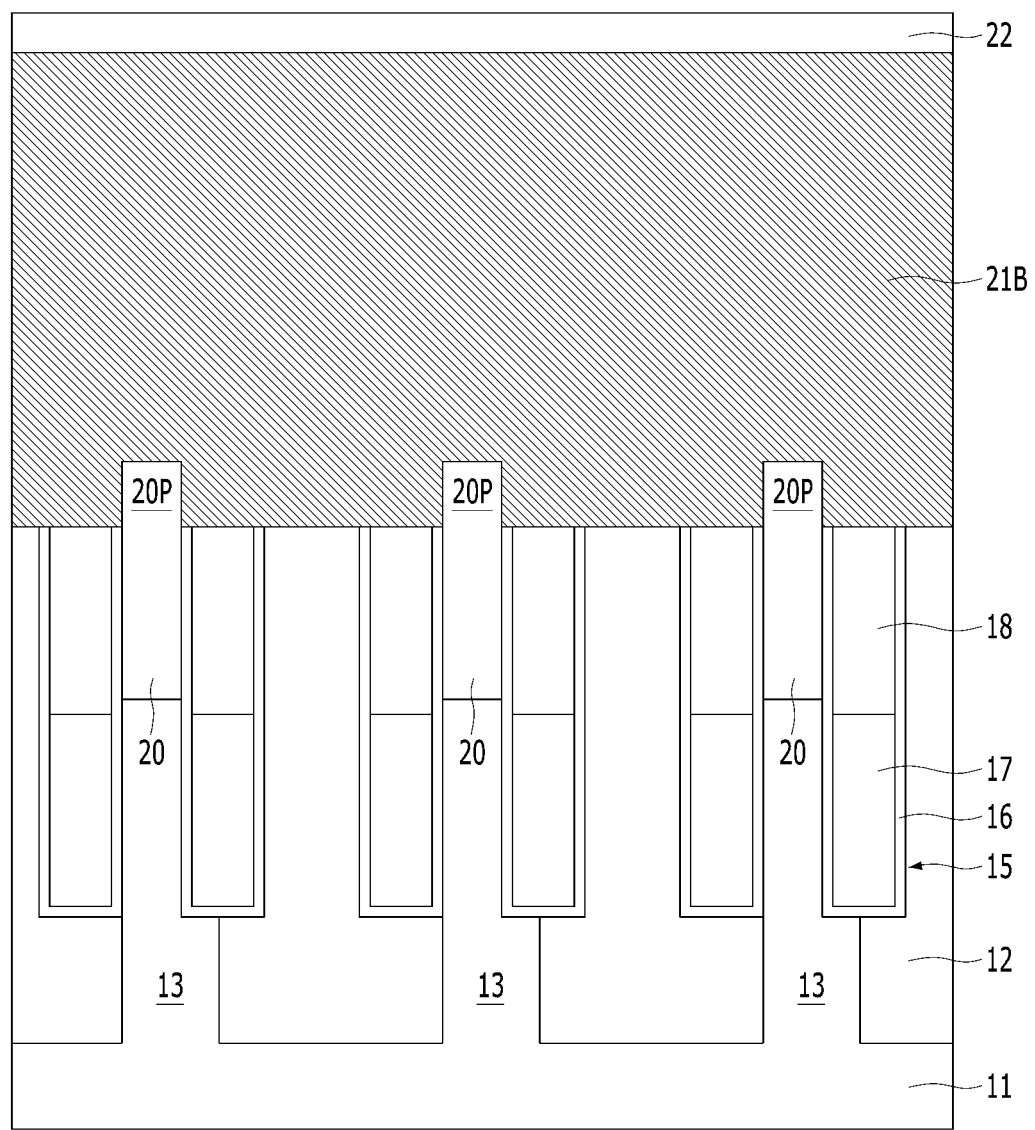

As shown in FIGS. 7A and 7B, the initial conductive layer 21A and the first protrusions 19P may be sequentially etched using the first mask layer 22. A portion of the second protrusions 20P may be etched while the first protrusions 19B are etched. Accordingly, conductive lines 21B may be formed, and trenches 21T may be formed between the conductive lines 21B. First and second line-shaped recess portions 19R and 20R may be formed under the trenches 21T. As shown in FIG. 7B, the conductive lines 21B may have a line shape covering the second protrusions 20P. The conductive lines 21B may be referred to as 'line-shape plugs'. That is, the conductive lines 21B may be line-shaped plugs.

The first line-shaped recess portions 19R may be formed by etching the first protrusions 19P, and the second line-shaped recess portions 20R may be formed by partially etching the second protrusions 20P. During the formation of the first and second line-shaped recess portions 19R and 20R, portions of the device isolation layer 12 may be etched by being self-aligned with the sidewalls of the conductive lines 21B.

Figure 19A:
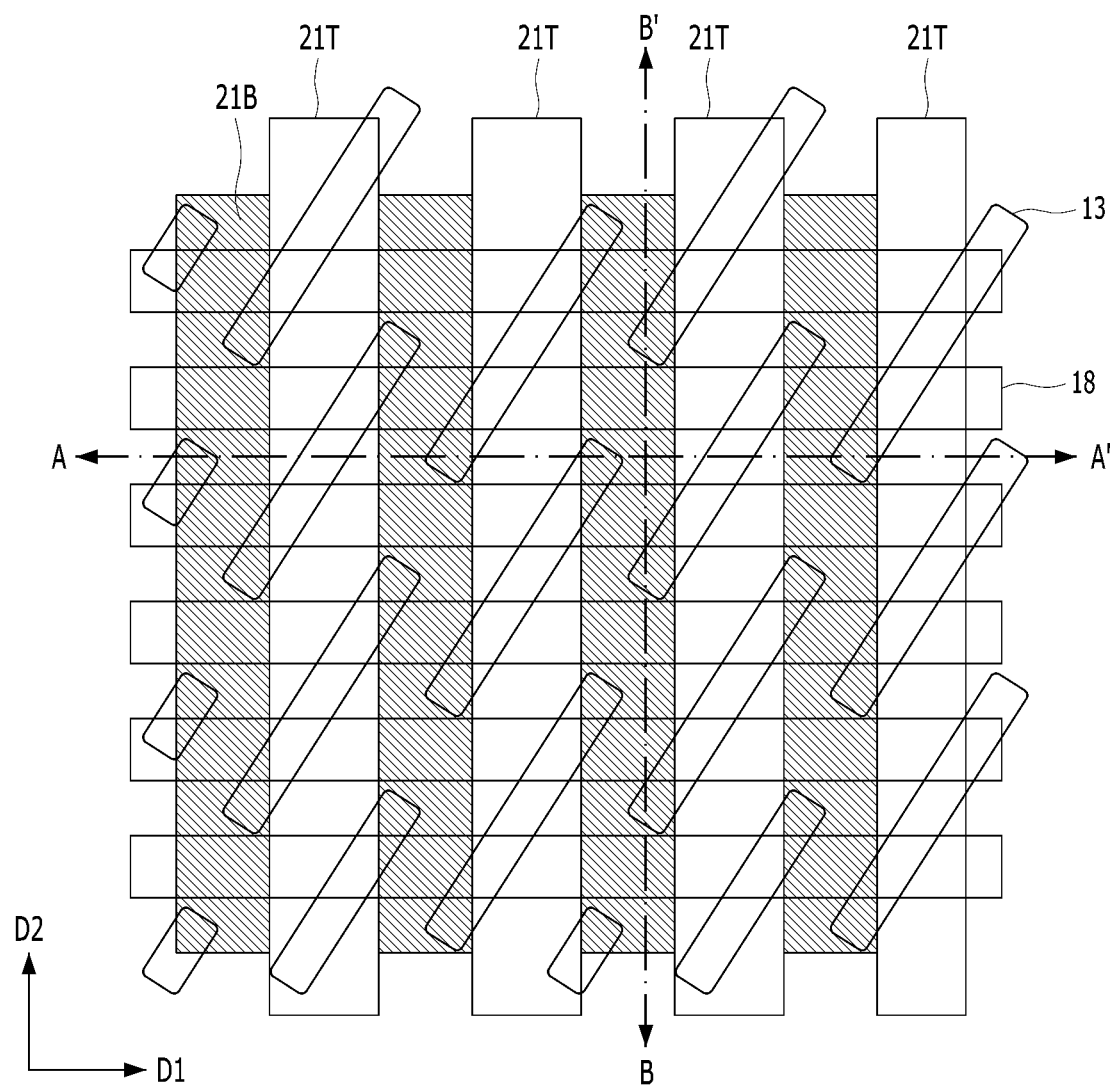
FIGS. 19A to 19E are plan views illustrating a fabrication method taken along lines A-A' and B-B' of FIG. 1A.

FIG. 19A is a plan view illustrating conductive lines 21B and trenches 21T. The trenches 21T may be disposed between the conductive lines 21B. The buried capping layers 18 may extend in the first direction D1, and the conductive lines 21B and the trenches 21T may extend in the second direction D2. The conductive lines 21B and the trenches 21T may vertically intersect the buried capping layer 18. The first impurity regions 19 may be completely exposed under the trenches 21T, and the second impurity regions 20 may be partially exposed.

Figure 8A:
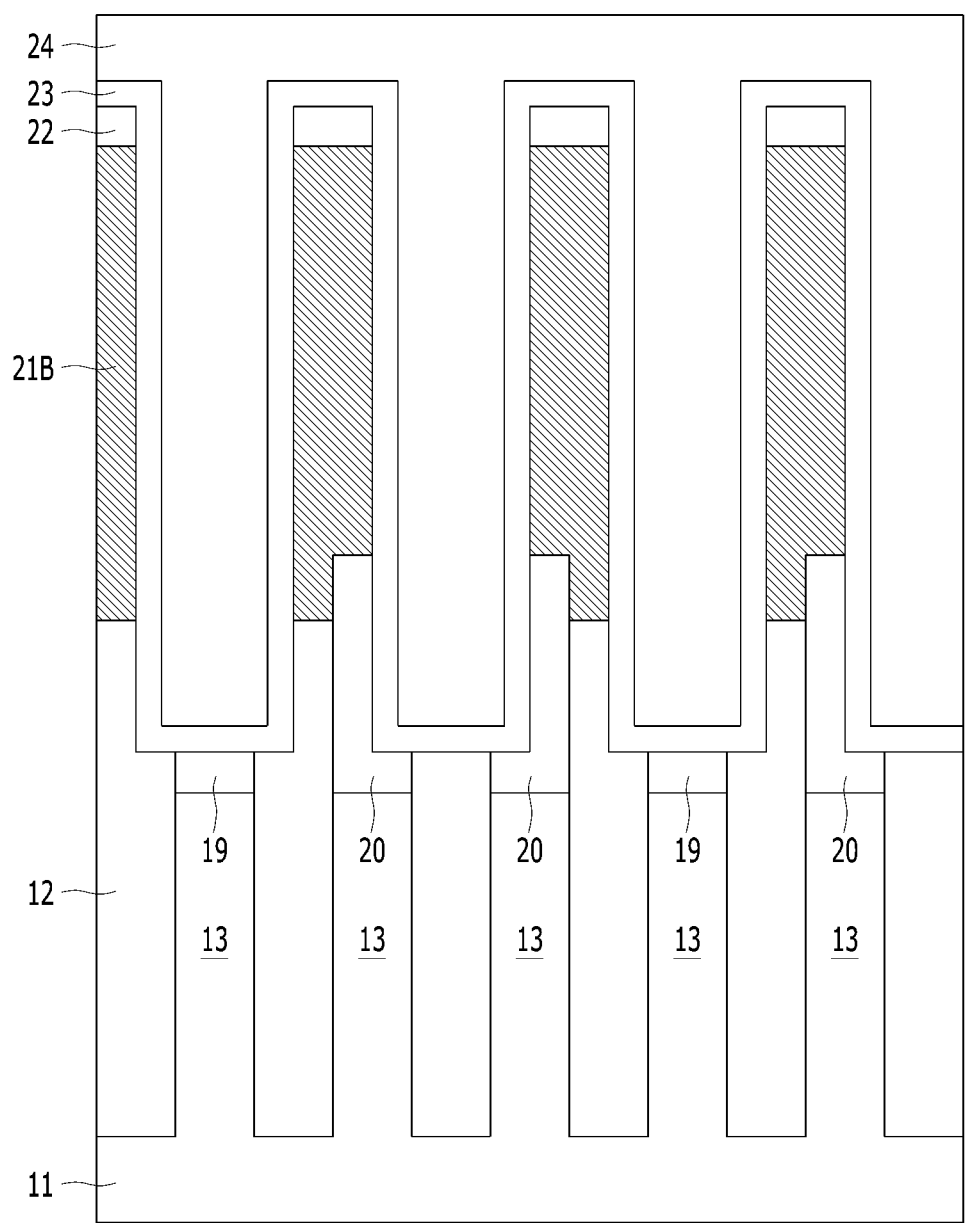
Figure 8B:
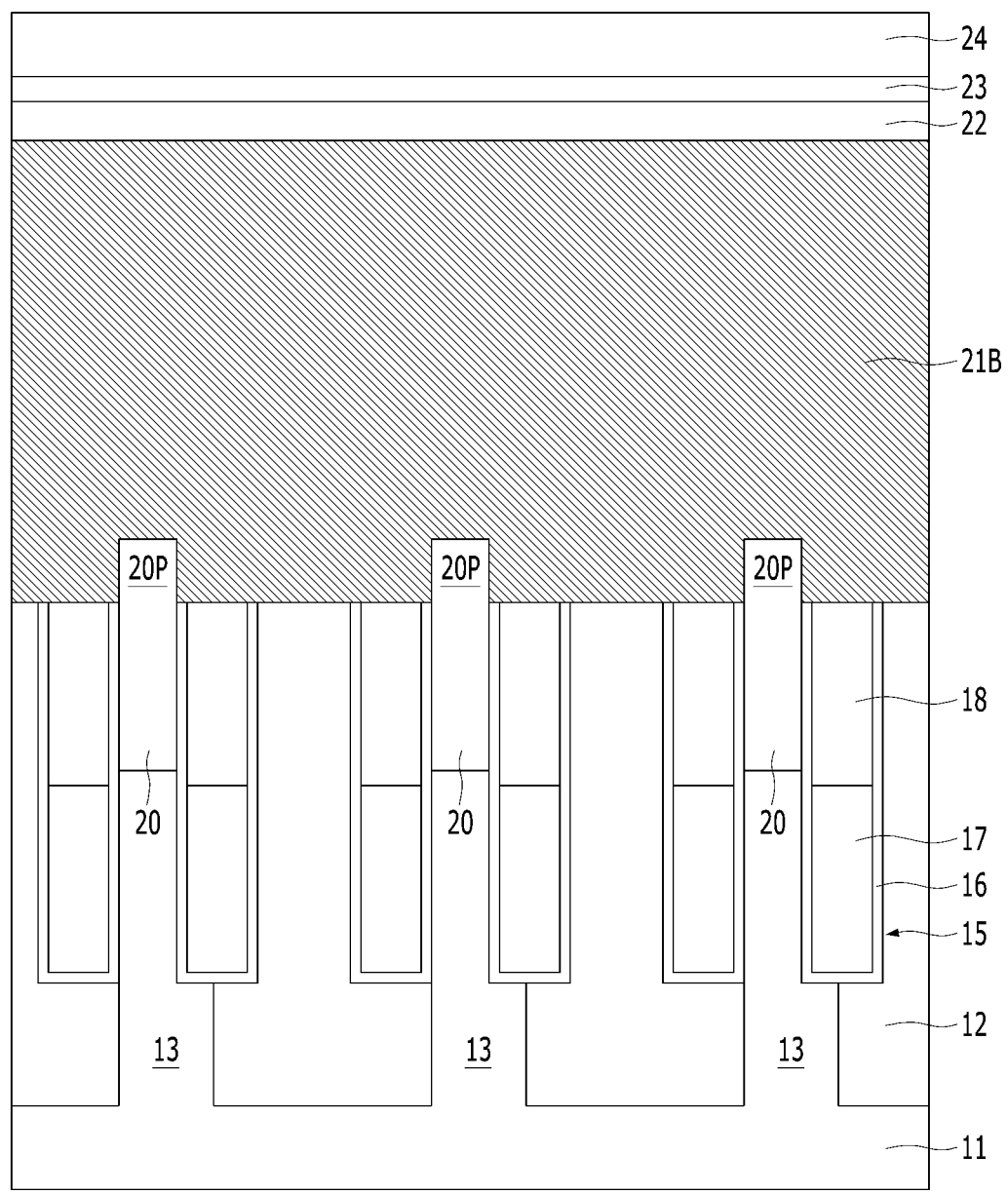

As shown in FIGS. 8A and 8B, a spacer layer 23 may be formed on the trenches 21T and the conductive lines 21B. The spacer layer 23 may include a dielectric layer or a stack of different dielectric layers. For example, the spacer layer 23 may include an oxide, a nitride, a low-k material, or a combination thereof. The low-k material may include SiCO, SiCN, SiOCN, SiBN or SiBCN. The spacer layer 23 may include KO, NO, and oxide alone, where K may refer to a low-k material, "N" may refer to a nitride, and "O" may refer to an oxide. In another embodiment, the spacer layer 23 may include an air gap. For example, the spacer layer 23 may have an N-A-N structure in which an air gap ("A") is disposed between nitrides.

A sacrificial material 24 may be formed on the spacer layer 23. The sacrificial material 24 may include a carbon-containing material. The sacrificial material 24 may be formed by a spin-on coating method. The sacrificial material 24 may include a carbon layer formed by a spin-on coating method. The sacrificial material 24 may fill the trenches 21T between neighboring conductive lines 21B and on the spacer layer 23.

Figure 9A:
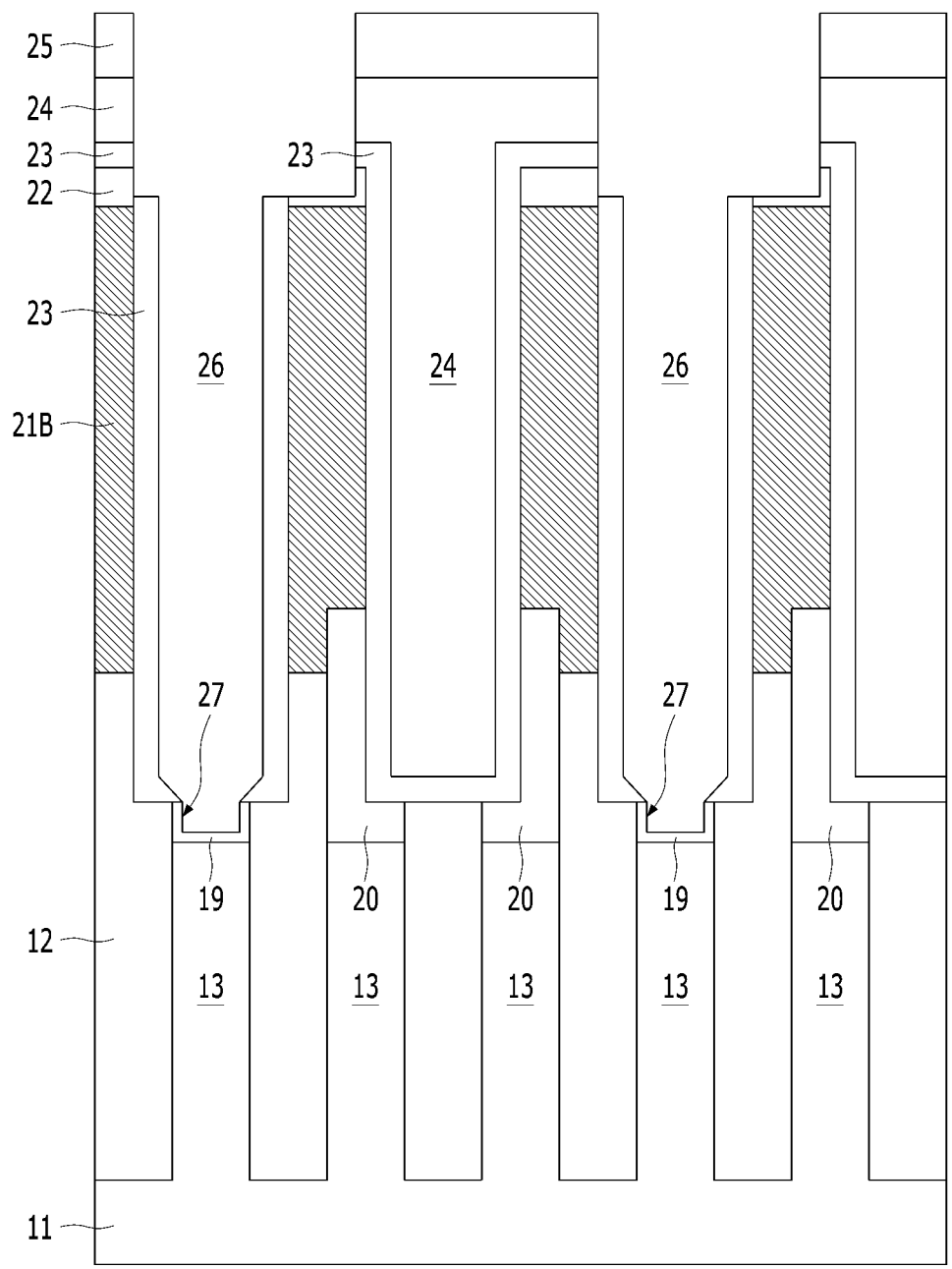
Figure 9B:
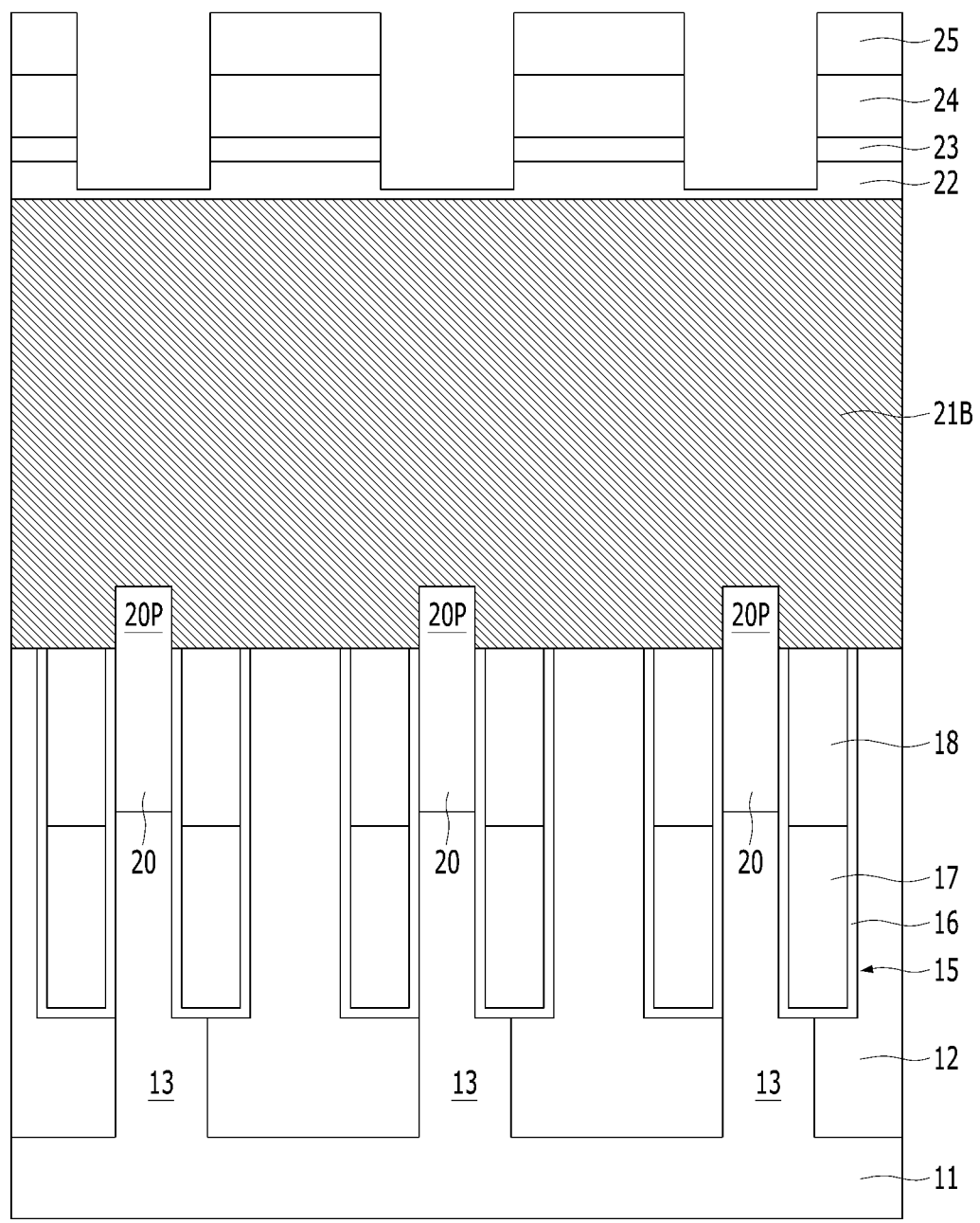

As shown in FIGS. 9A and 9B, a second mask layer 25 may be formed on the sacrificial material 24. The second mask layer 25 may have a pattern extending in a direction crossing the conductive lines 21B. The second mask layer 25 may include a photoresist pattern or a hard mask material.

The sacrificial material 24 and the spacer layer 23 may be etched using the second mask layer 25. Accordingly, hole-shaped openings 26 may be formed between the conductive lines 21B. The hole-shaped openings 26 may be formed as portions of the sacrificial material 24 are etched between the conductive lines 21B. The hole-shaped openings 26 may expose the first impurity regions 19. Subsequently, the exposed first impurity regions 19 may be recessed to a predetermined depth, and thus, hole-shaped recess portions 27 may be formed. The hole-shaped recess portions 27 may be formed by being self-aligned with sidewalls of the spacer layer 23.

Figure 19B:
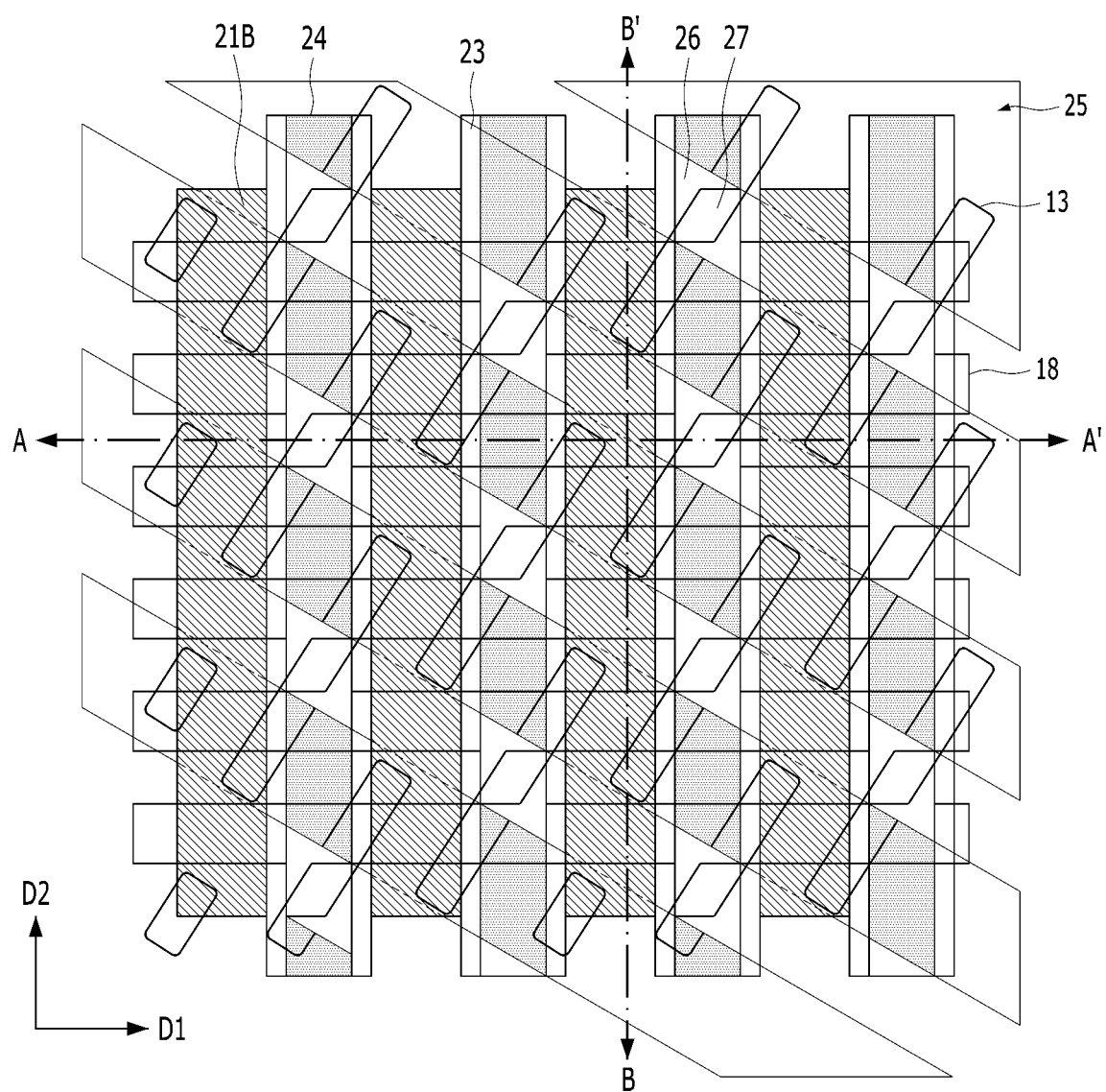

FIG. 19B is a plan view of the hole-shaped openings 26 and the second mask layer 25. The hole-shaped openings 26 may be formed in the sacrificial material 24. The second mask layer 25 may cross the conductive lines 21B in an oblique direction. The hole-shaped openings 26 may have a rhombus-shaped pattern. The hole-shaped recess portions 27 may be smaller than the hole-shaped openings 26. The hole-shaped recess portions 27 may have a rhombus-shaped pattern.

Figure 10A:
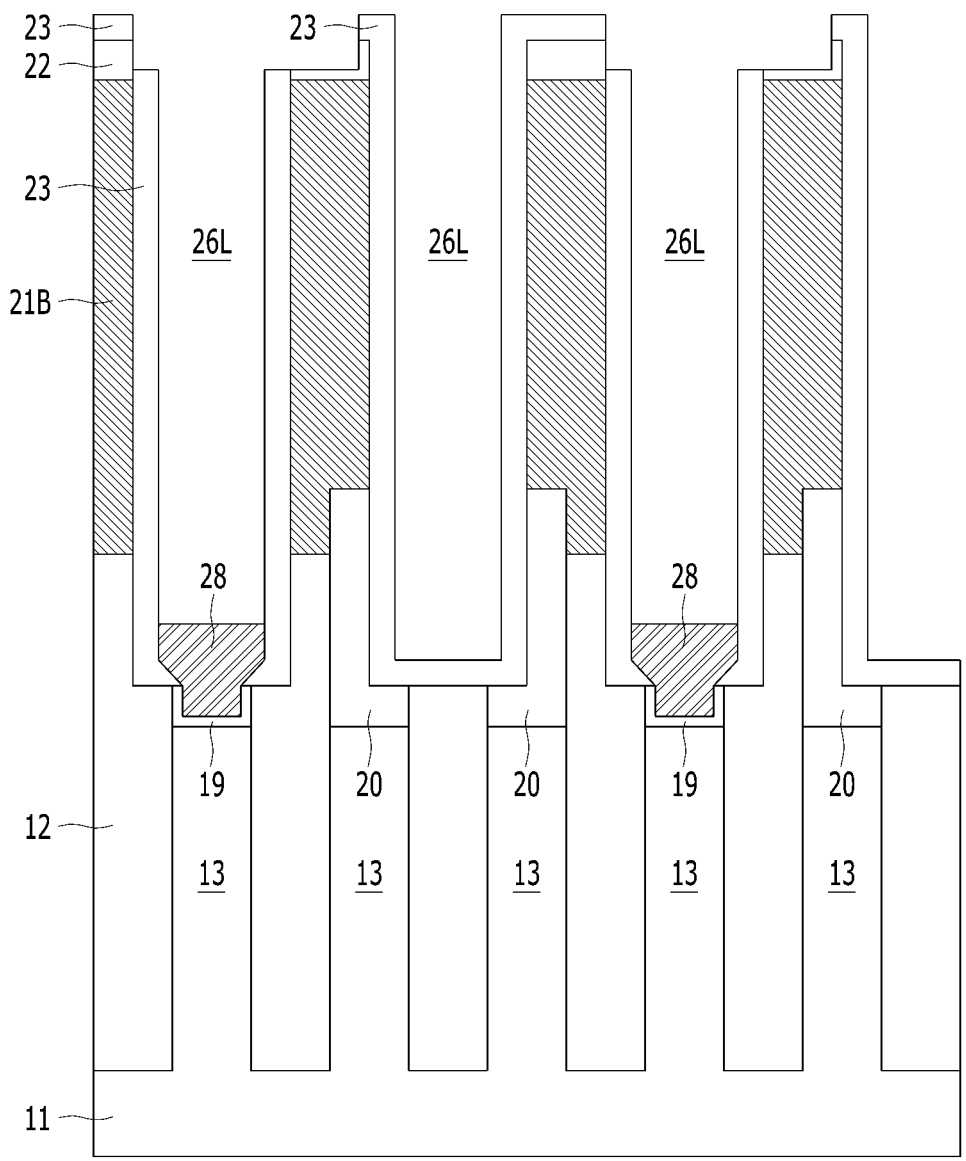
Figure 10B:
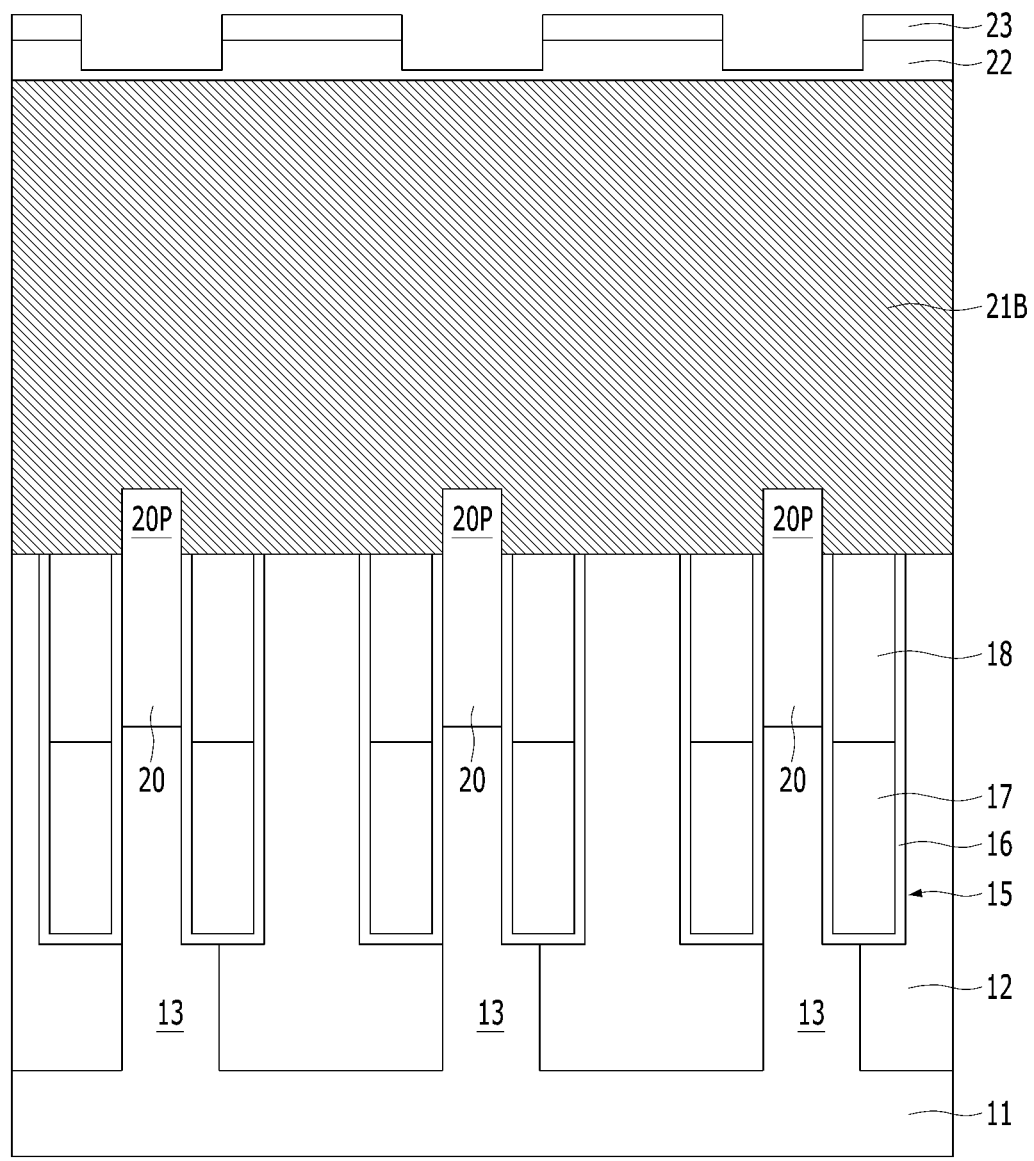

As shown in FIGS. 10A and 10B, the second mask layer 25 and the sacrificial material 24 may be removed. As the sacrificial material 24 is removed, a bit line opening 26L may be formed between the conductive lines 21B. The bit line opening 26L may be referred to as a damascene pattern.

Next, lower-level plugs 28 filling the hole-shaped recess portions 27 may be formed. The lower-level plugs 28 may be formed by selective epitaxial growth (SEG). The lower-level plugs 28 may include an epitaxial silicon layer. The lower-level plugs 28 may include an epitaxial silicon layer doped with phosphorus. For example, the lower-level plugs 28 may include SEG SiP. In this way, the lower-level plugs 28 may be formed void-free by selective epitaxial growth. In another embodiment, the lower-level plugs 28 may be formed by deposition and etch back processes of a polysilicon layer. The upper surface of the lower-level plugs 28 may be at a higher level than the bottom surface of the spacer layer 23. Upper surfaces of the lower-level plugs 28 may be at a lower level than upper surfaces of the device isolation layer 12 and upper surfaces of the second impurity region 20.

Figure 19C:
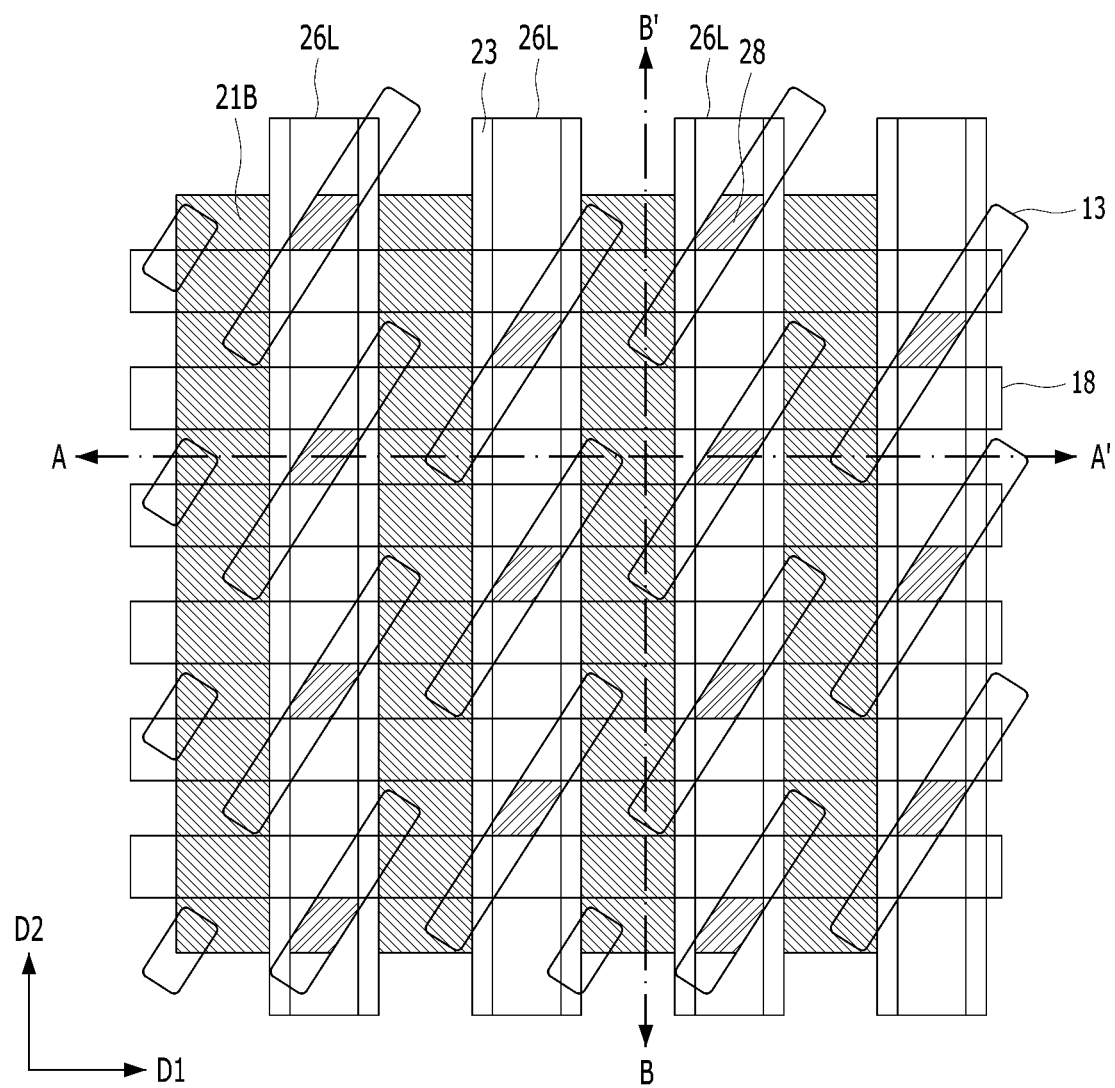

FIG. 19C is a plan view of the bit line openings 26L and the lower-level plugs 28, in which the lower-level plugs 28 may be disposed below the bit line openings 26L. The bit line opening 26L may have a line shape. The lower-level plugs 28 may have a rhombus-shaped pattern. The lower-level plugs 28 may be formed in the active region 13 and may not extend to the device isolation layer 12 and the buried capping layer 18.

As such, the lower-level plugs 28 may be embedded in the substrate 11. Accordingly, the lower-level plugs 28 may have a recessed shape disposed at a lower level than the upper surface of the substrate 11, that is, the upper surface of the second impurity region 20. The lower-level plugs 28 and the conductive lines 21B may be spaced apart from each other by the spacer layer 23. The upper surface of the lower-level plugs 28 and the bottom surface of the conductive lines 21B may not be disposed at the same horizontal level. Bottom surfaces of the conductive lines 21B may be disposed at a higher horizontal level than the upper surface of the lower-level plugs 28.

The second impurity regions 20 and the lower-level plugs 28 may not contact each other. The lower-level plugs 28 may not be formed on the second impurity region 20 covered by the sacrificial material 24 and the spacer layer 23.

Figure 11A:
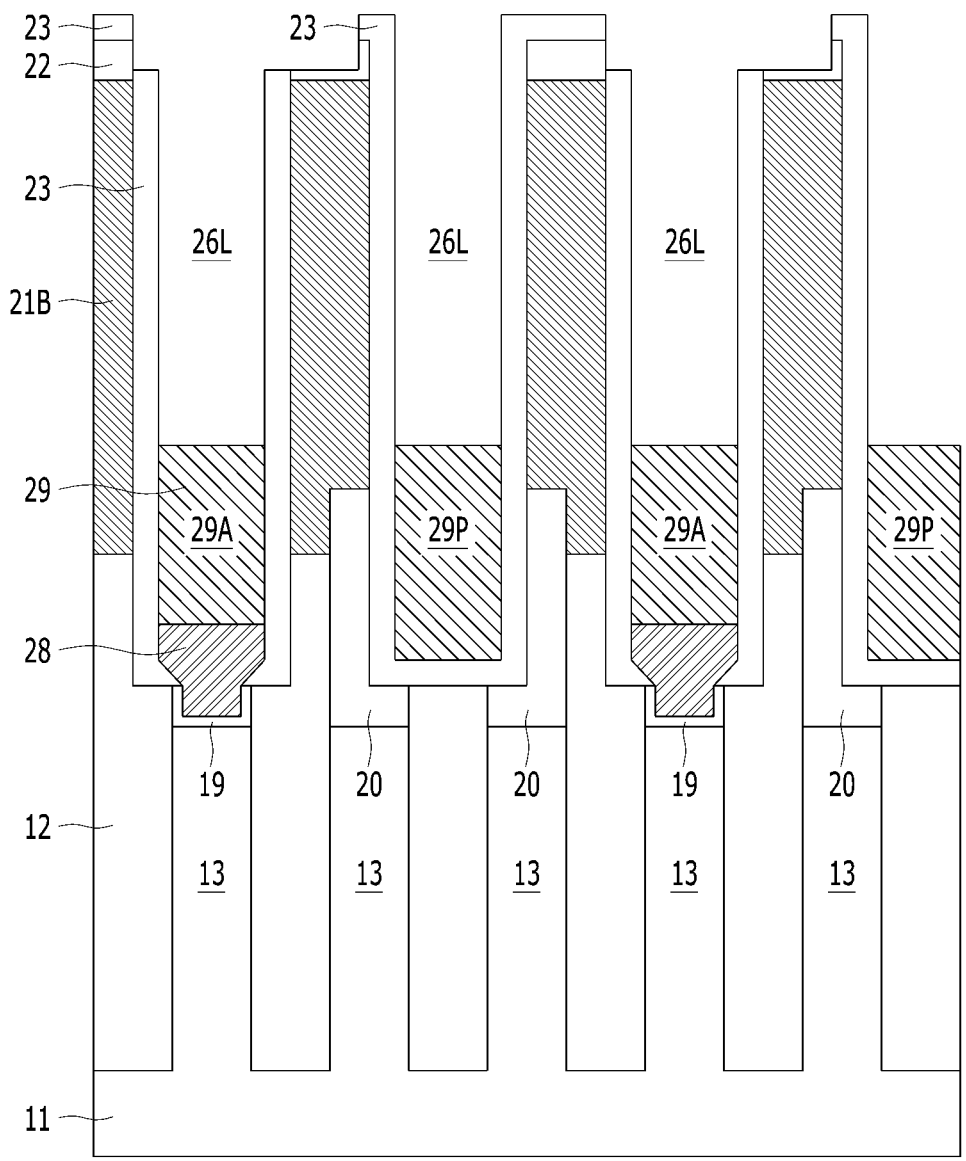
Figure 11B:
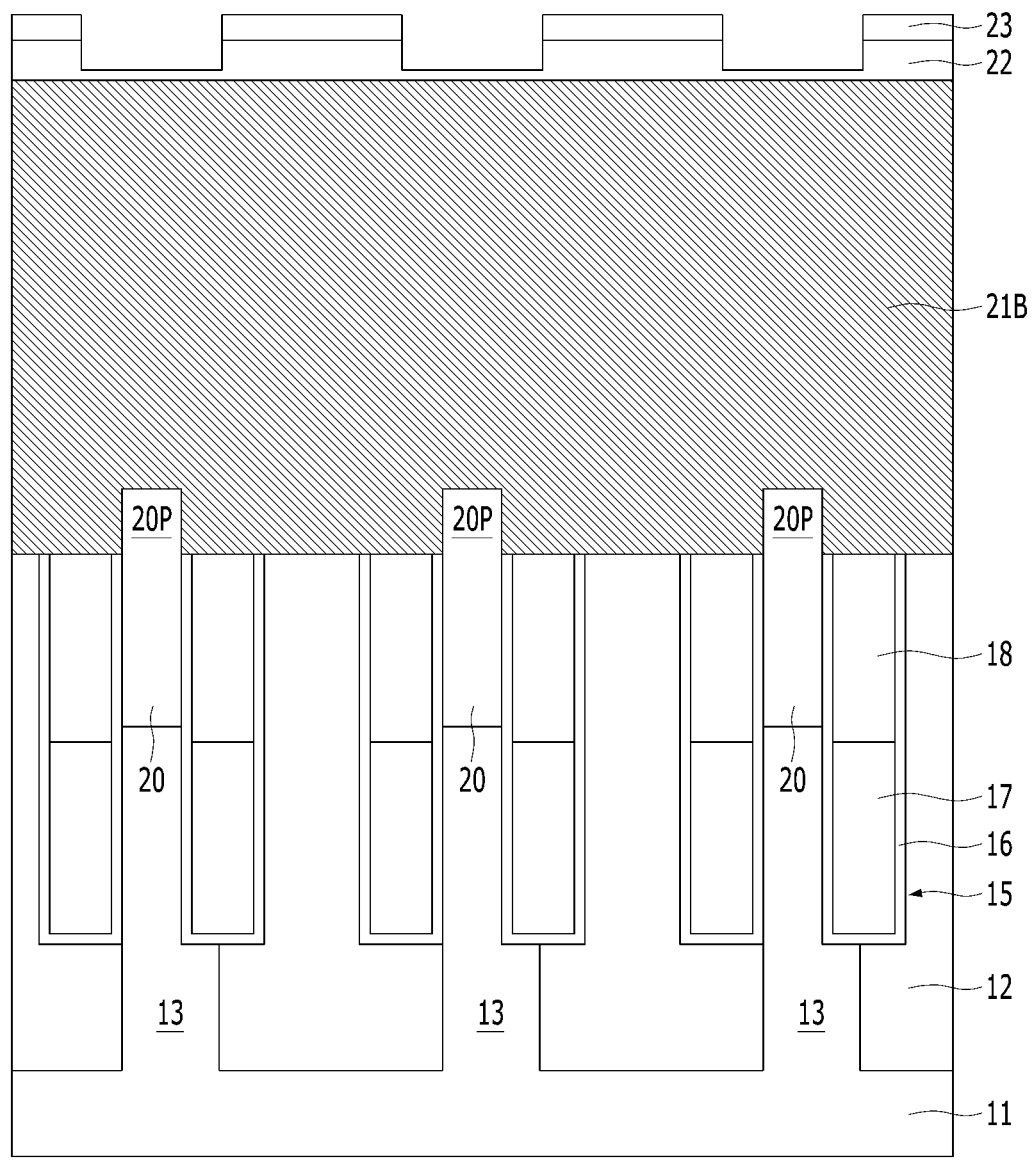

As shown in FIGS. 11A and 11B, buried bit lines 29 may be formed on the lower-level plugs 28. To form the buried bit line 29, deposition and etch back processes of a conductive material may be performed. The buried bit line 29 may partially fill the bit line opening 26L. The buried bit line 29 and the conductive lines 21B may include horizontally overlapping portions.

The buried bit line 29 includes a metal-containing material. The buried bit line 29 may include a metal, a metal nitride, a metal silicide, or a combination thereof. In this embodiment, the buried bit line 29 may include tungsten (W). In another embodiment, the buried bit line 29 may include a stack of titanium nitride and tungsten (TiN/W). In this case, the titanium nitride may serve as a barrier.

The buried bit lines 29 may include an active bit line 29A and a passing bit line 29P. The active bit line 29A may refer to a portion connected to the lower-level plug 28, and the passing bit line 29P may refer to a portion not connected to the lower-level plug 28. Sidewalls and a bottom surface of the passing bit line 29P may be covered by the spacer layer 23. Sidewalls of the active bit line 29A may be covered by the spacer layer 23, and a bottom surface of the active bit line 29A may be connected to the lower-level plug 28. An ohmic contact layer (not shown) between the lower-level plugs 28 and the buried bit line 29 may be further included. The ohmic contact layer may include metal silicide.

Figure 19D:
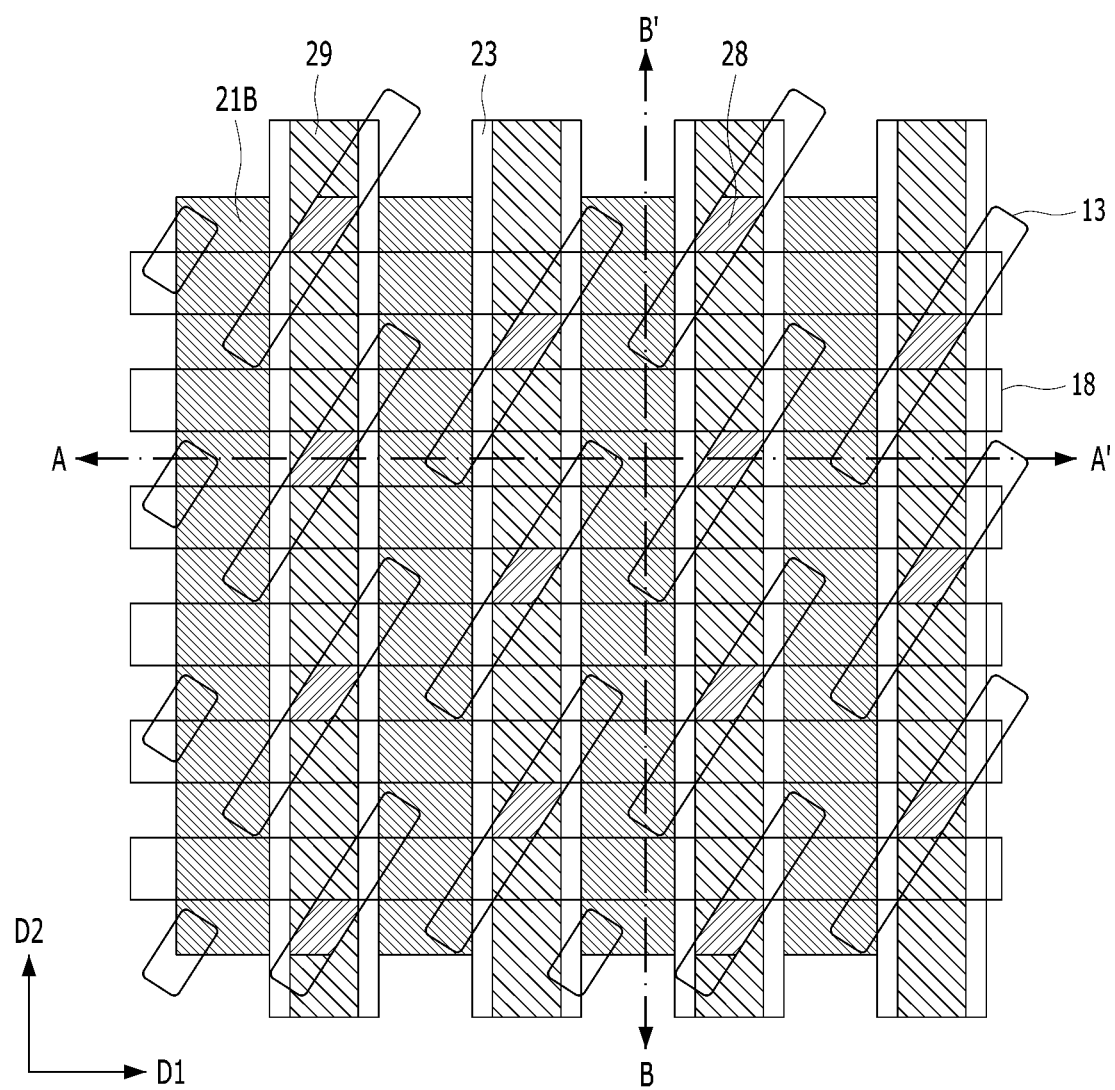

FIG. 19D is a plan view of the buried bit lines 29, wherein the buried bit lines 29 and the lower-level plugs 28 may overlap. The buried bit lines 29 and the conductive lines 21B may be parallel to each other. A spacer layer 23 may be disposed between the conductive lines 21B and the buried bit lines 29. The buried bit lines 29 may correspond to the second buried conductive line 111 as referenced in FIGS. 1A to 1C.

Figure 12A:
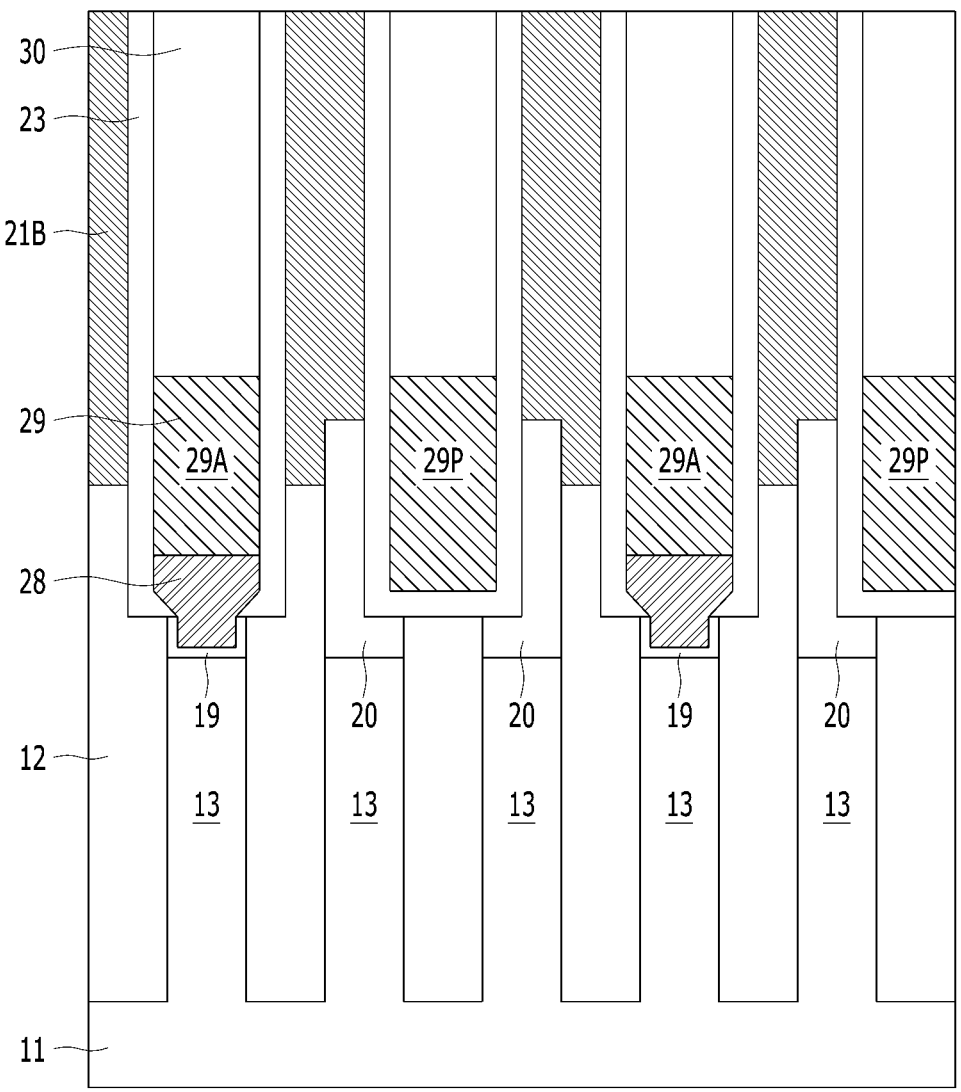
Figure 12B:
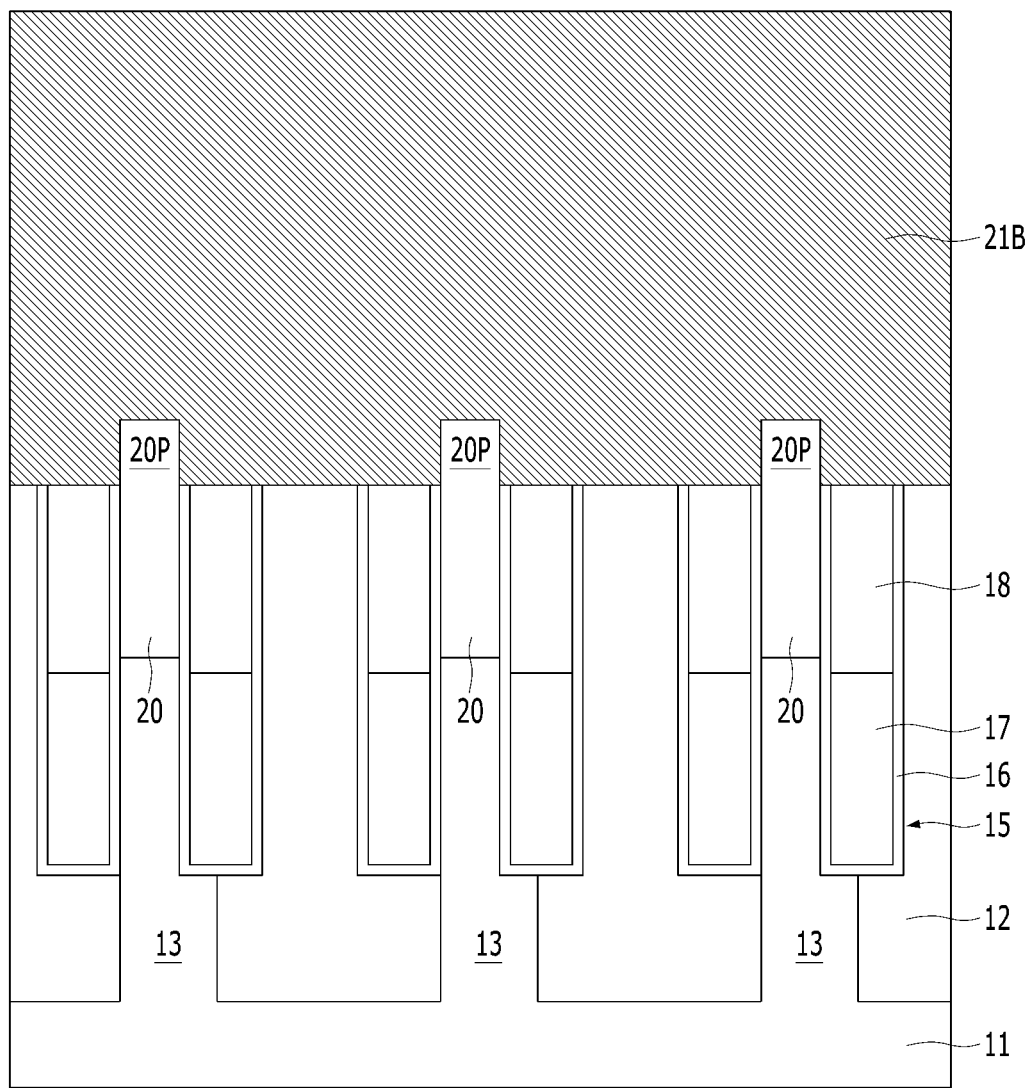

As shown in FIGS. 12A and 12B, a buried hard mask layer 30 may be formed on the buried bit line 29. The buried hard mask layer 30 may fill the bit line opening 26L on the buried bit line 29. For example, to form the buried hard mask layer 30, after depositing silicon nitride on the buried bit line 29, the silicon nitride may be planarized until the upper surface of the conductive lines 21B is exposed. A portion of the spacer layer 23 and the first mask layer 22 may be removed during the silicon nitride planarization process. Accordingly, the spacer layer 23 may remain on sidewalls of the lower-level plug 28, the buried bit line 29, and the buried hard mask layer 30. The buried hard mask layer 30 may include silicon oxide or silicon nitride. The stack of the lower-level plug 28, the buried bit line 29, and the buried hard mask layer 30 is abbreviated as a bit line structure.

When viewed from a top view, the bit line structures and the conductive lines 21B may be parallel to each other. The conductive lines 21B may be disposed between the bit line structures.

Figure 13A:
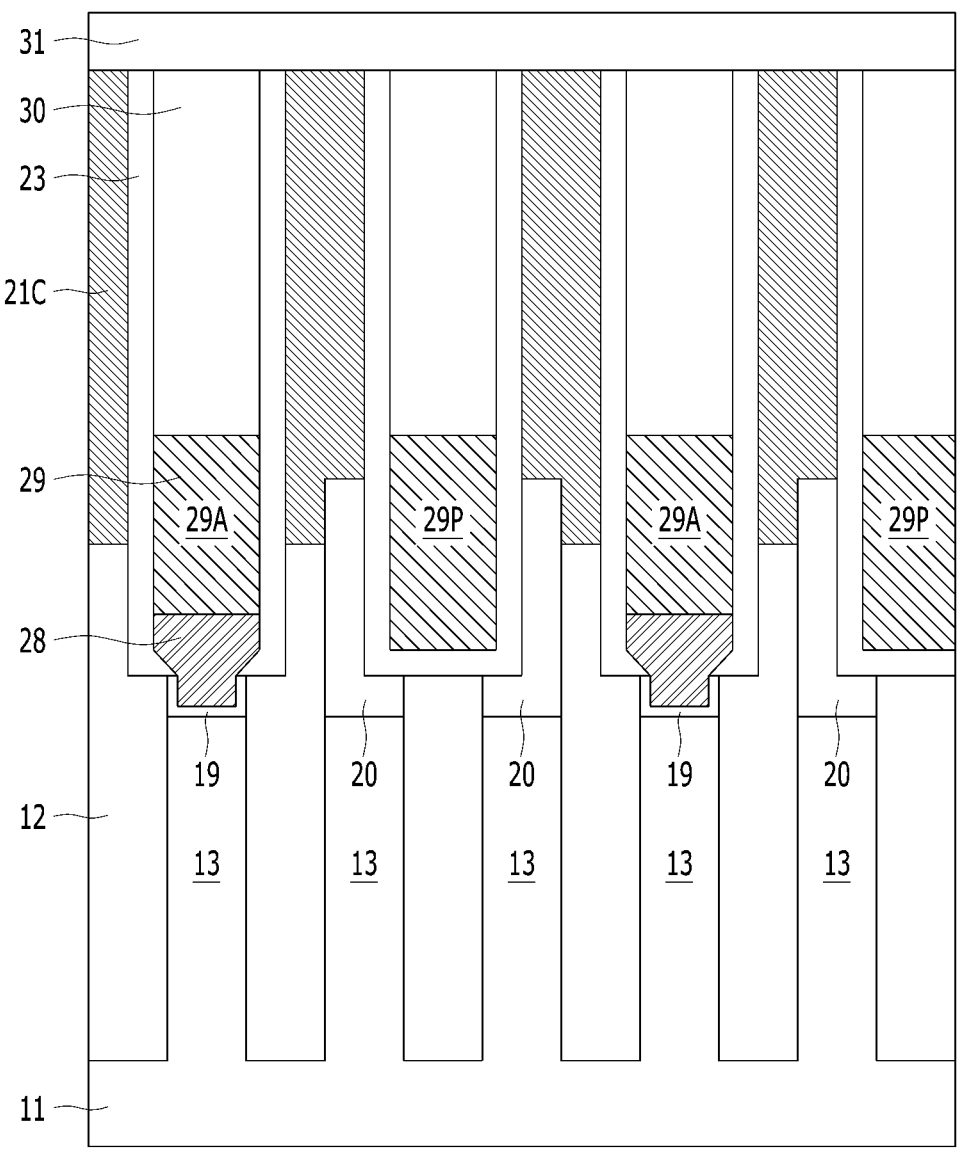
Figure 13B:
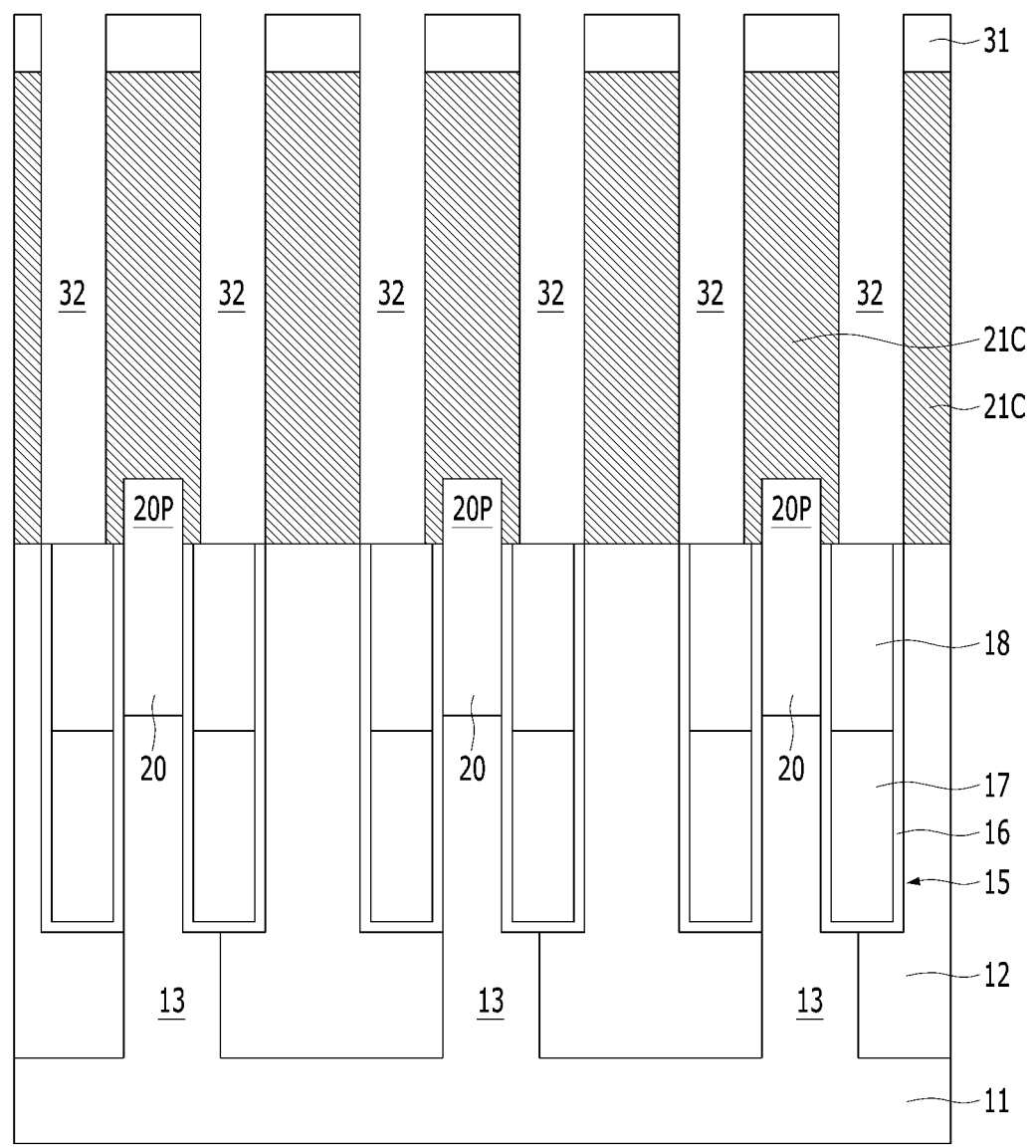

As shown in FIGS. 13A and 13B, a third mask layer 31 may be formed. The third mask layer 31 may include a photoresist pattern or a hard mask material. When viewed from a top view, the third mask layer 31 may extend in a direction crossing the conductive lines 21B and the bit line structures.

The conductive lines 21B may be selectively etched using the third mask layer 31. Accordingly, island-shaped conductive patterns 21C may be formed. Isolation grooves 32 may be formed between the island-shaped conductive patterns 21C. The island-shaped conductive patterns 21C may cover upper surfaces and sidewalls of the second protrusions 20P. Some island-shaped conductive patterns 21C may extend to be disposed on the device isolation layer 12.

Figure 19E:
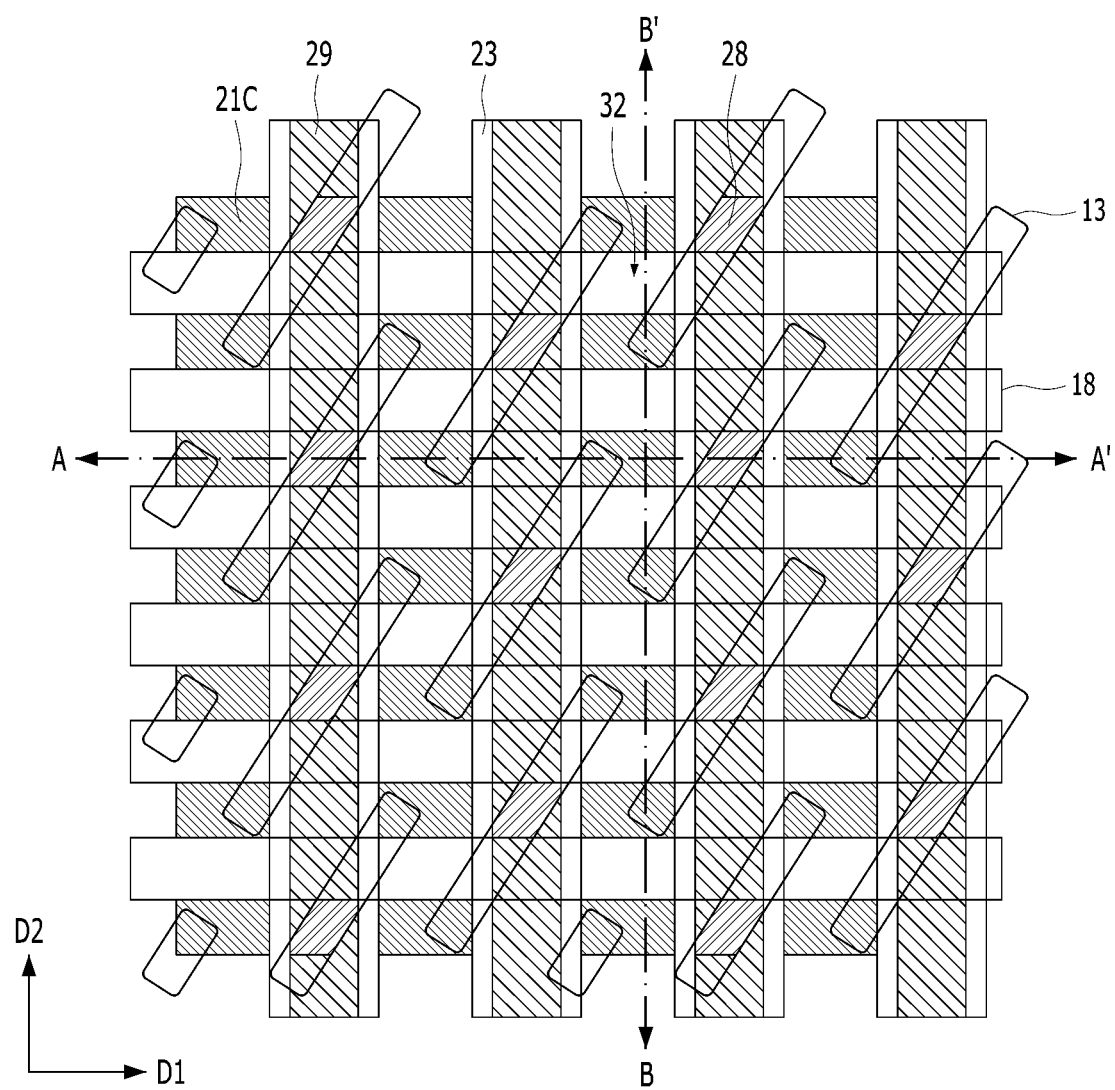

FIG. 19E is a plan view of the island-shaped conductive patterns 21C, wherein the island-shaped conductive patterns 21C may be disposed between neighboring bit line structures. For example, the island-shaped conductive patterns 21C and the isolation grooves 32 may be alternately formed between neighboring bit line structures in the extending direction of the buried bit line 29, that is, in the second direction D2.

Figure 14A:
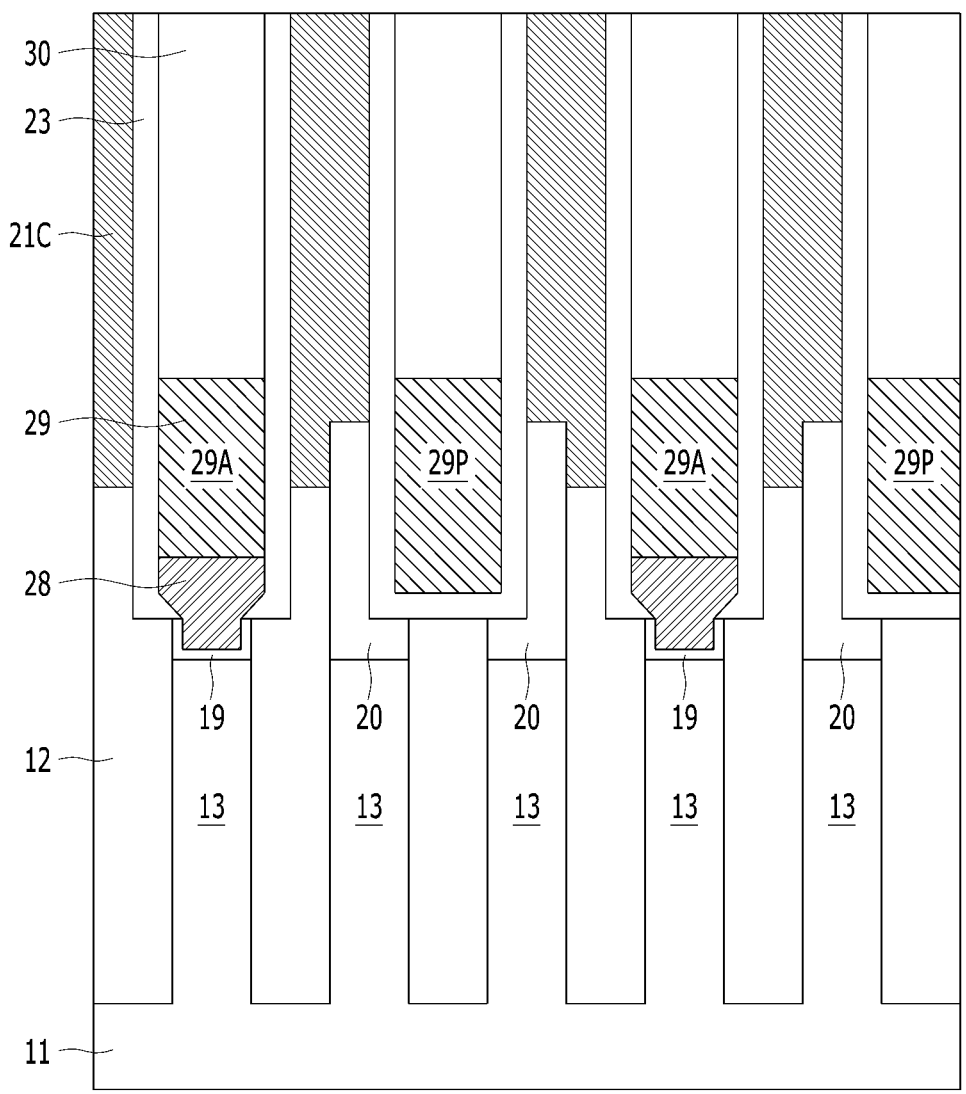
Figure 14B:
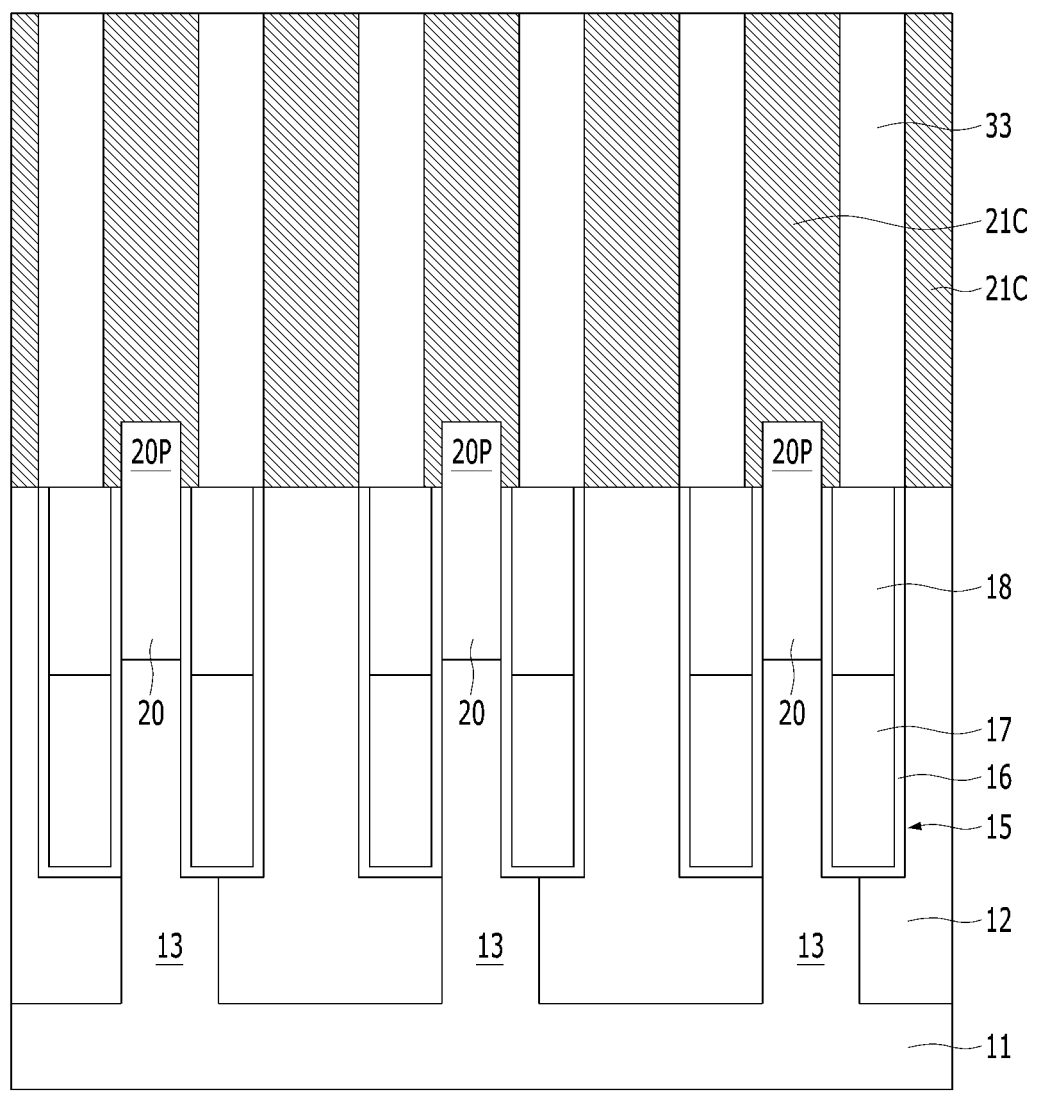

As shown in FIGS. 14A and 14B, after the third mask layer 31 is removed, the plug isolation layer 33 filling the isolation grooves 32 may be formed. The plug isolation layers 33 may be formed between neighboring bit line structures. The neighboring island-shaped conductive patterns 21C may be spaced apart by the plug isolation layers 33. A plurality of plug isolation layers 33 and a plurality of island-shaped conductive patterns 21C may be alternately disposed between neighboring bit line structures. The plug isolation layer 33 may include silicon nitride or a low-k material. When the plug isolation layer 33 includes a low-k material, parasitic capacitance between the neighboring island-shaped conductive patterns 21C with the plug isolation layer 33 interposed therebetween may be reduced. The plug isolation layer 33 may include SiCO, SiCN, SiOCN, SiBN, or SiBCN. The plug isolation layer 33 may include a low-k material different from that of the spacer layer 23. For example, the spacer layer 23 may include a carbon-containing low-k material, and the plug isolation layer 33 may include a boron-containing low-k material. The spacer layer 23 may include SiCO, SiCN, or SiOCN, and the plug isolation layer 33 may include SiBN or SiBCN.

Figure 15A:
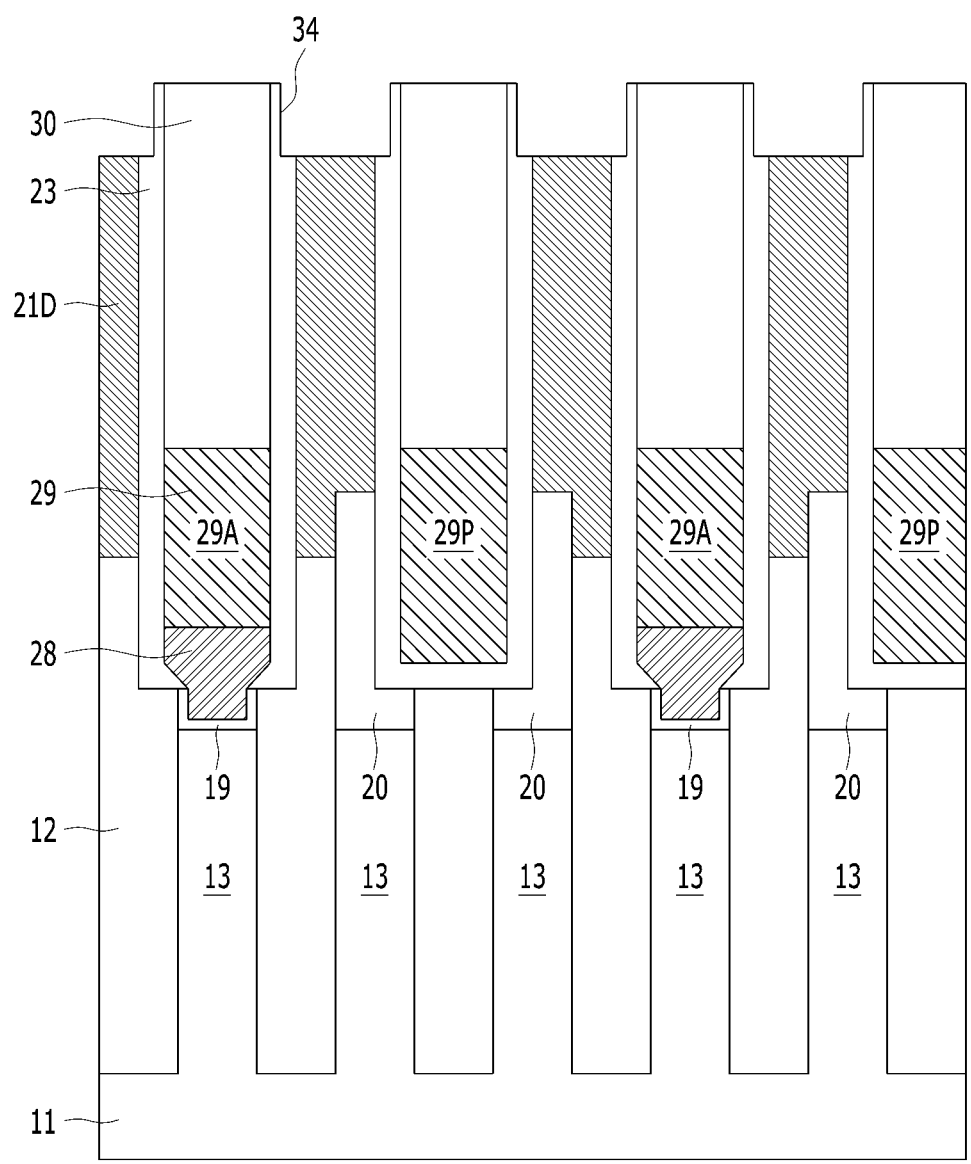
Figure 15B:
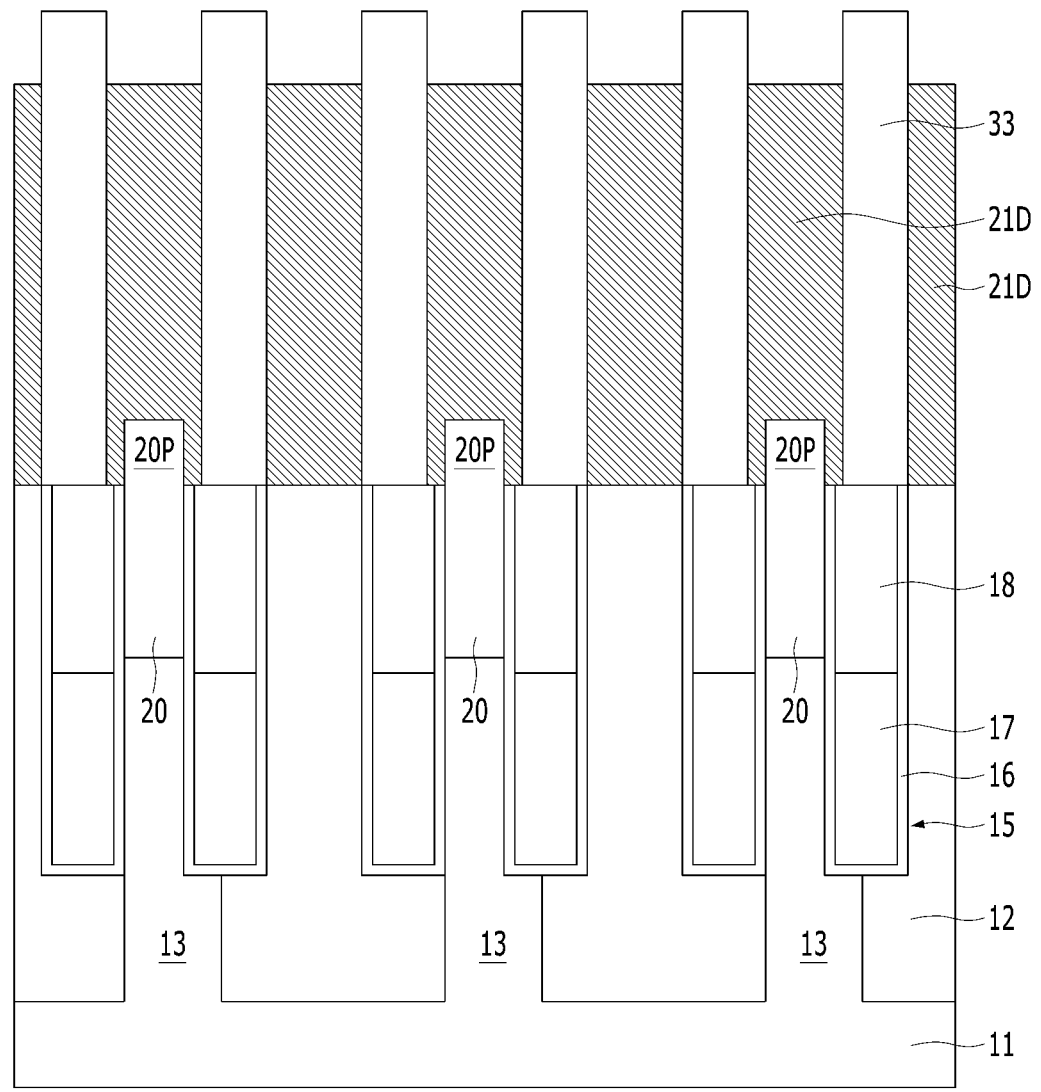

As shown in FIGS. 15A and 15B, upper regions of the island-shaped conductive patterns 21C may be recessed to a predetermined depth. The island-shaped conductive patterns 21C may remain as indicated by reference numeral 21D, and the island-shaped conductive patterns 21D may include an upper surface at a lower level than the upper surface of the buried hard mask layer 30.

Portions of the spacer 23 exposed by the island-shaped conductive patterns 21D may be trimmed to form a trim portion 34.

Figure 16A:
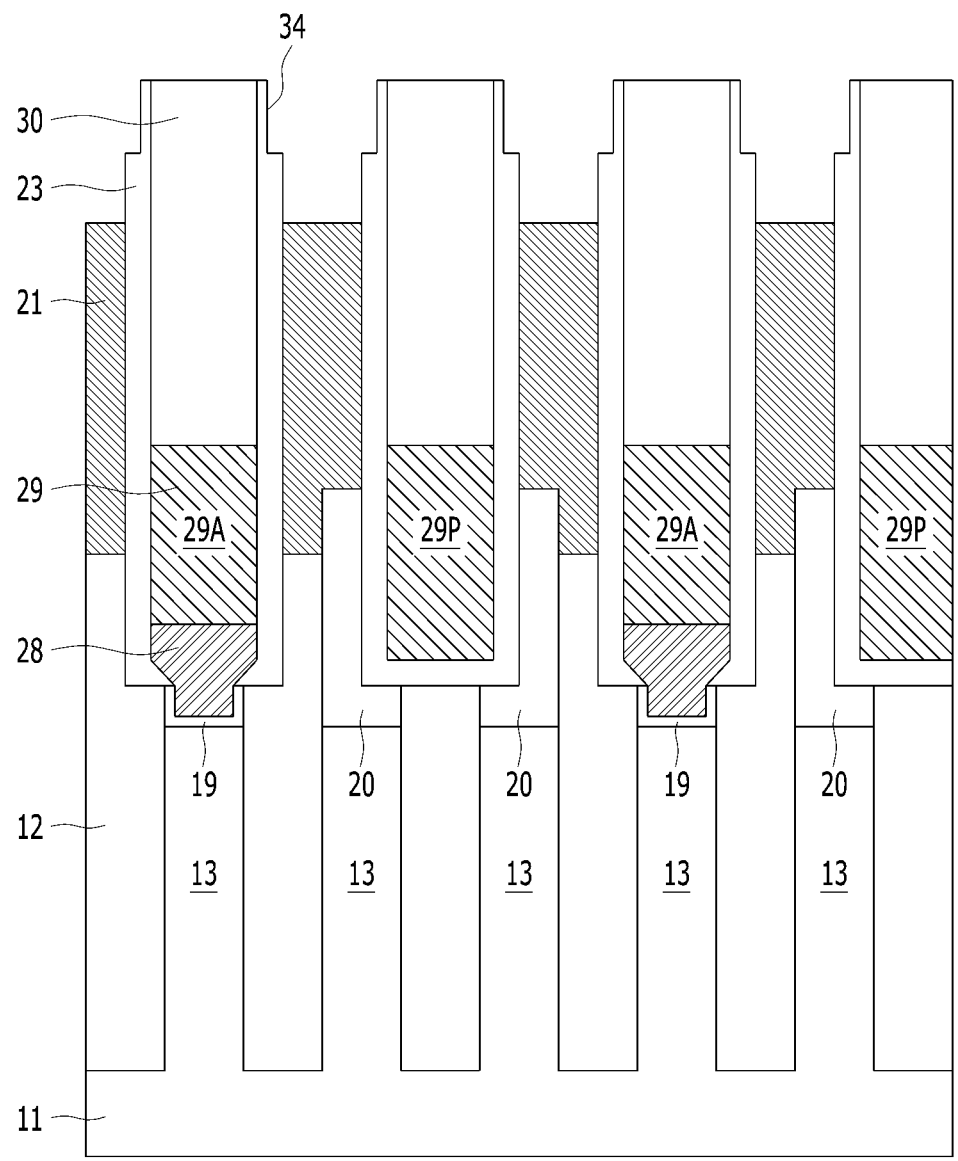
Figure 16B:
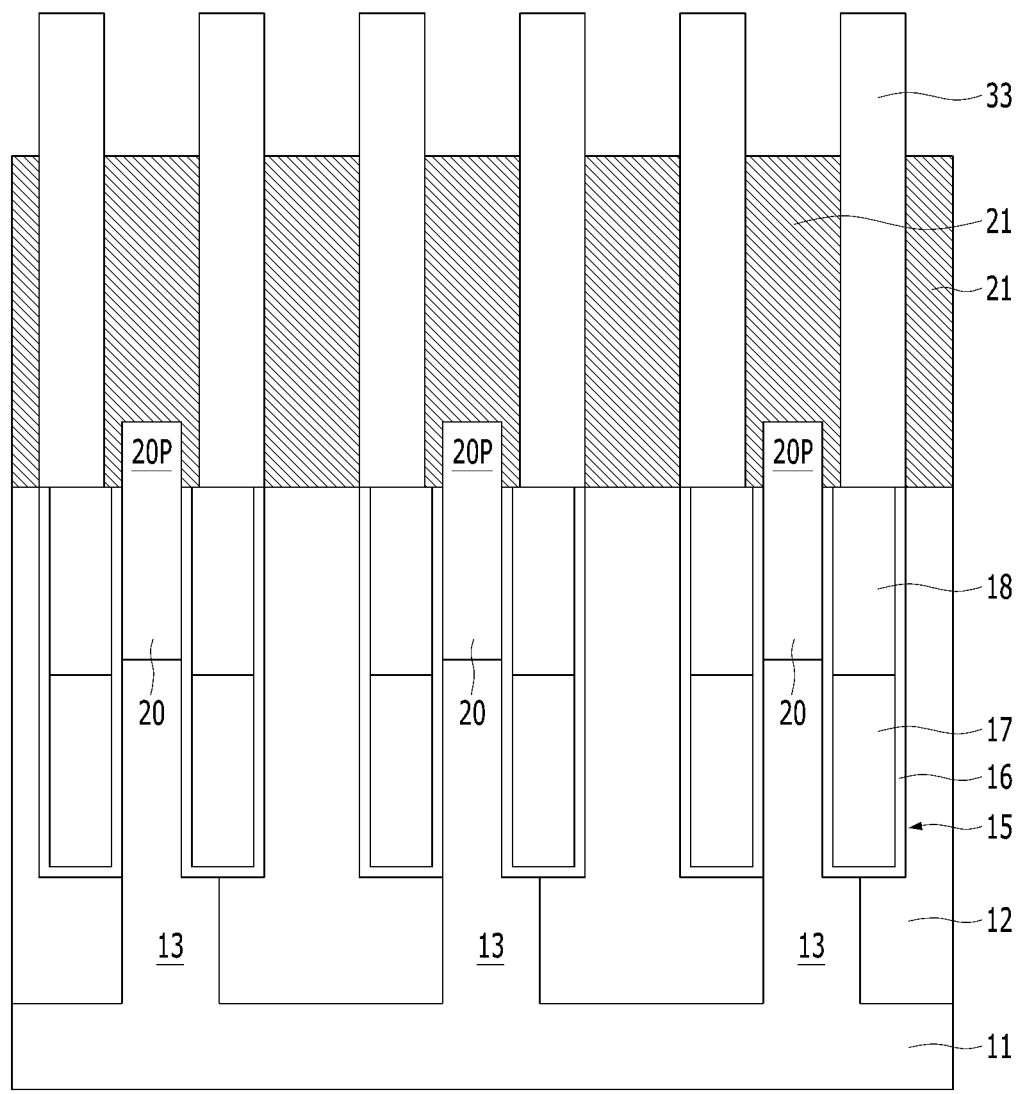

As shown in FIGS. 16A and 16B, the island-shaped conductive patterns 21D may be additionally recessed. Accordingly, upper-level plugs 21 may be formed.

Through the above-described series of processes, the conductive lines 21B of FIGS. 7A and 7B may be patterned into the upper-level plugs 21. For example, the conductive lines 21B may be patterned into island-shaped conductive patterns 21C, and upper-level plugs 21 may be formed by recessing upper portions of the island-shaped conductive patterns 21C.

Figure 17A:
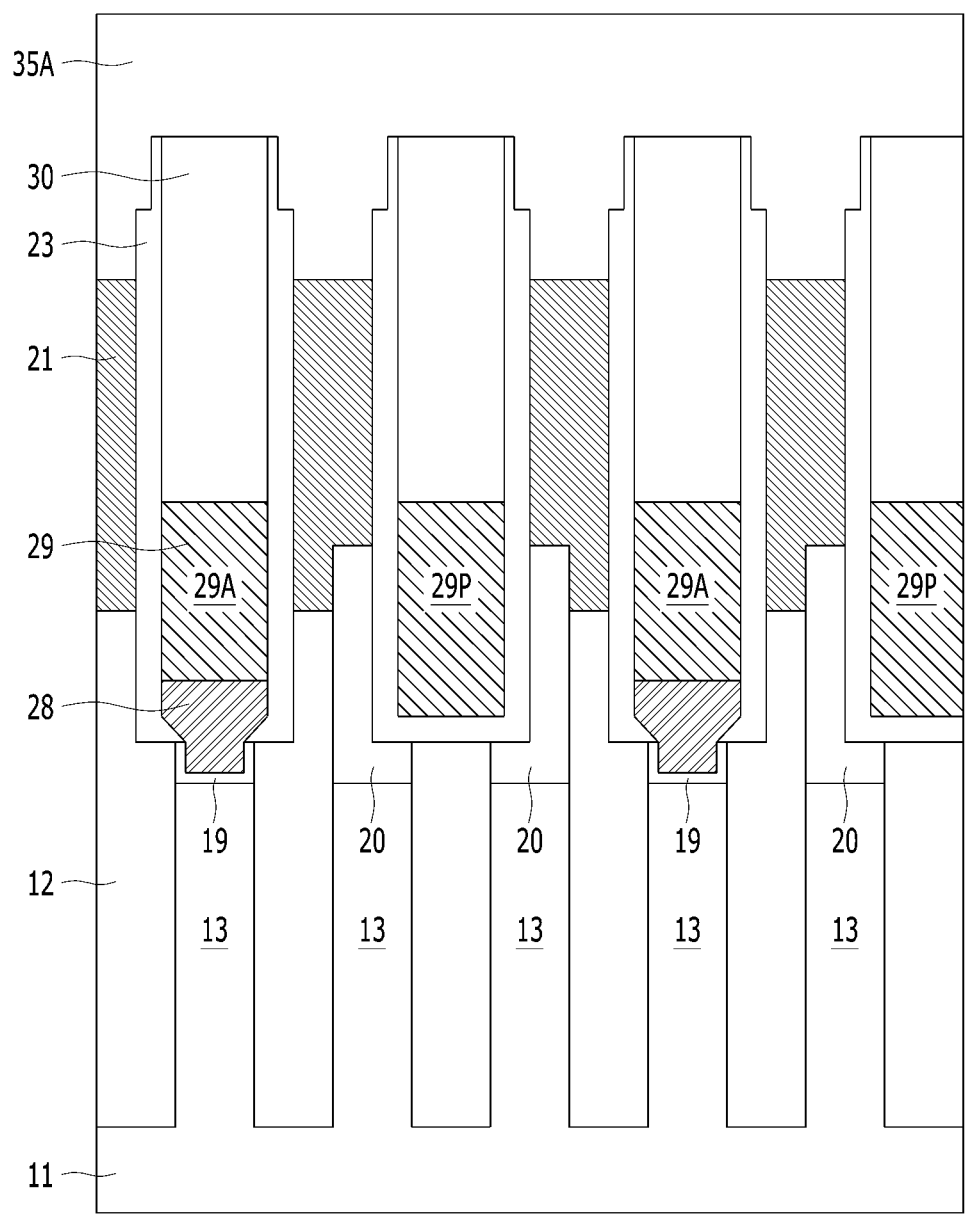
Figure 17B:
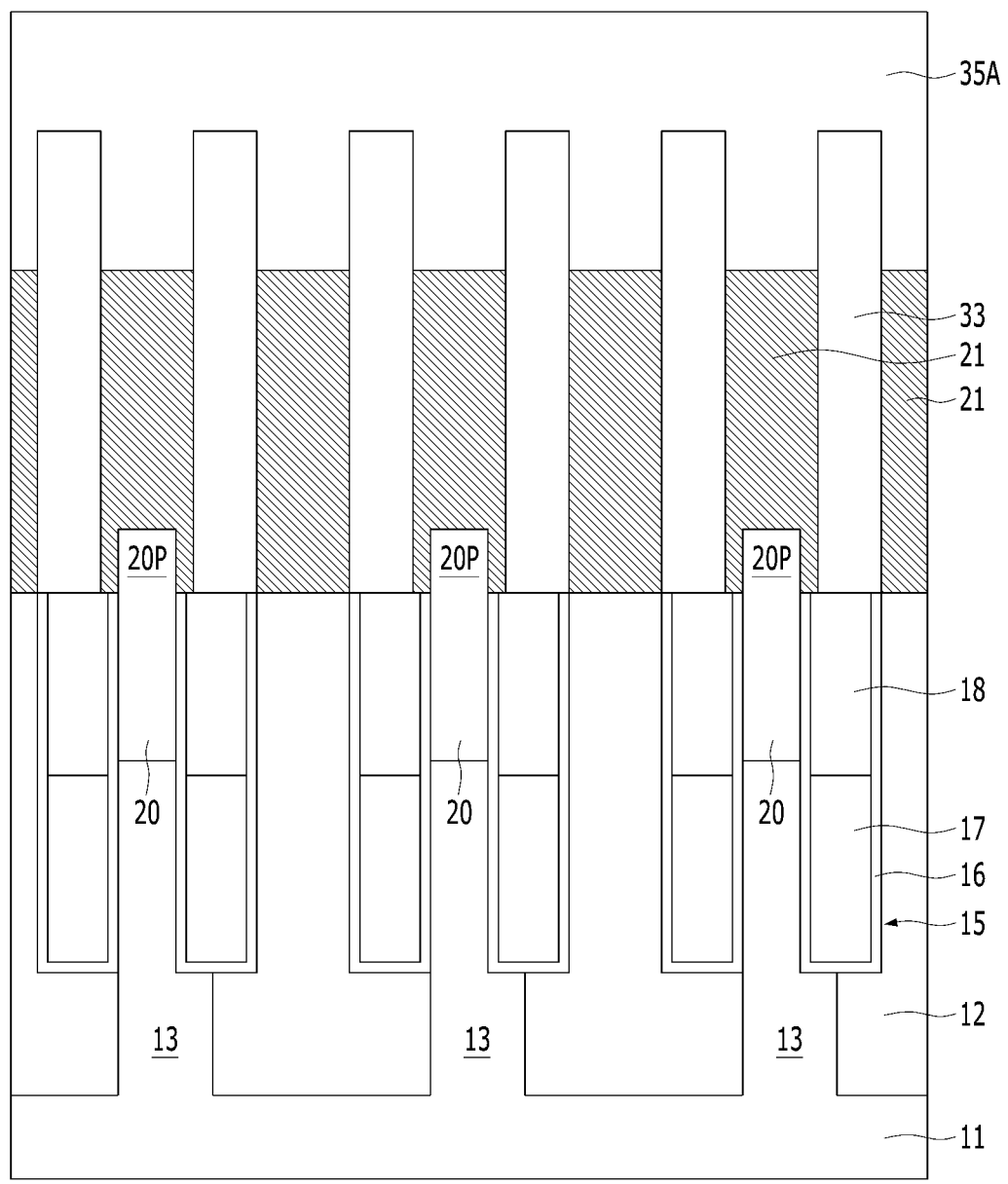

As shown in FIGS. 17A and 17B, a metal-based material 35A may be formed on the upper-level plugs 21. The metal-based material 35A may include a metal nitride, a metal material, or a combination thereof.

Figure 18A:
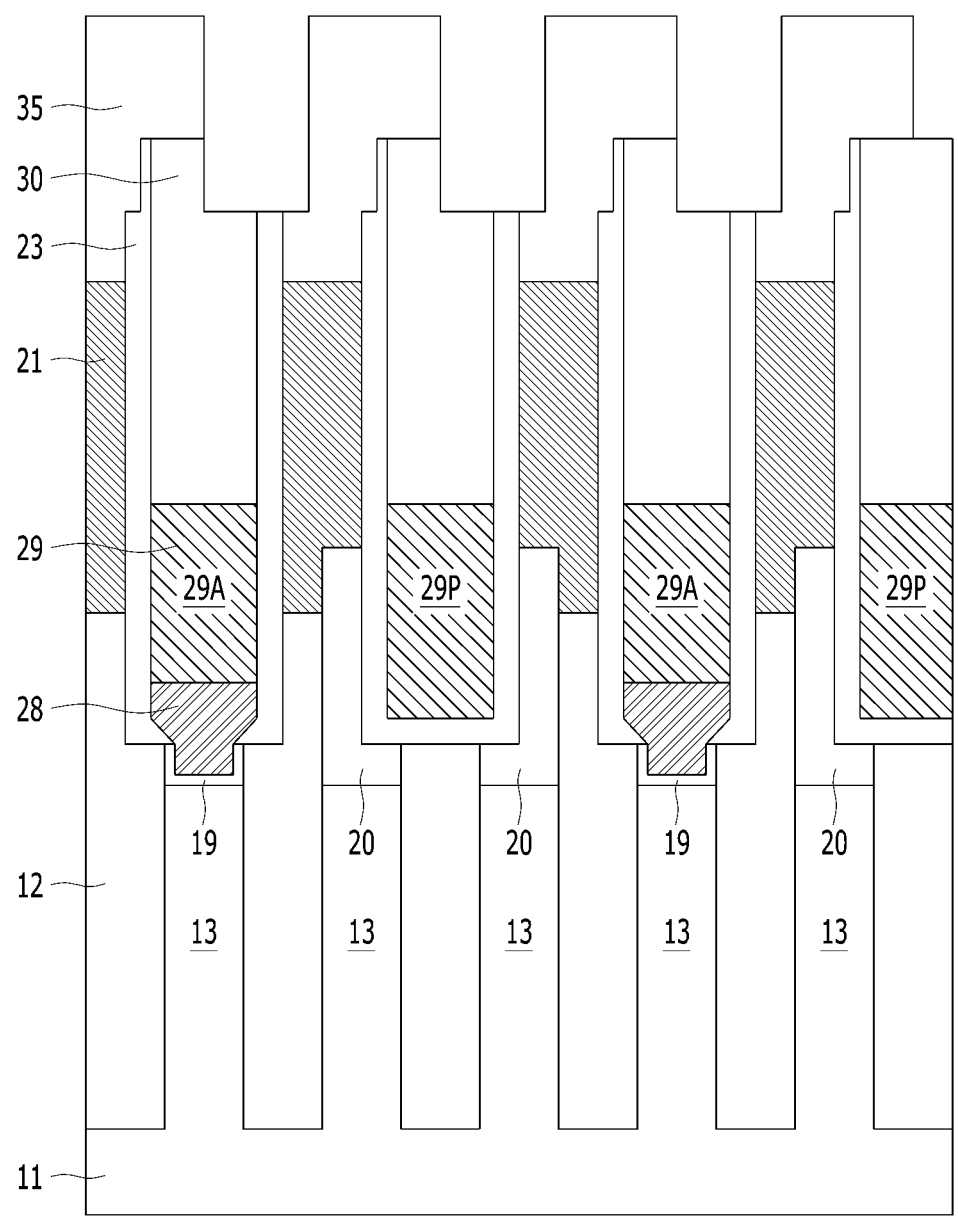
Figure 18B:
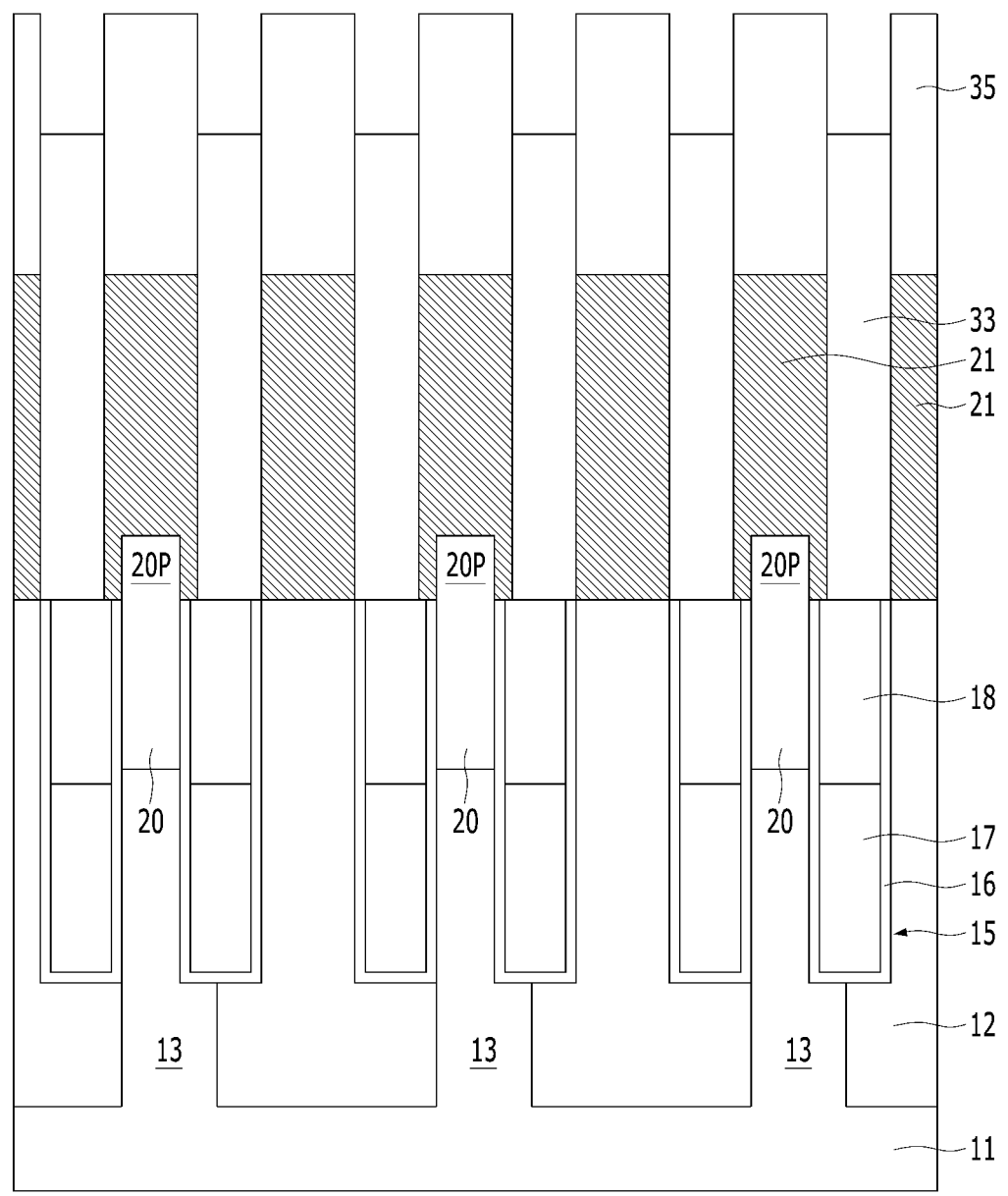

As shown in FIGS. 18A and 18B, the top-level plugs 35 may be formed by etching the metal-based material 35A. Portions of the top-level plugs 35 may extend to cover a top surface of the buried hard mask layer 30.

Figure 20:
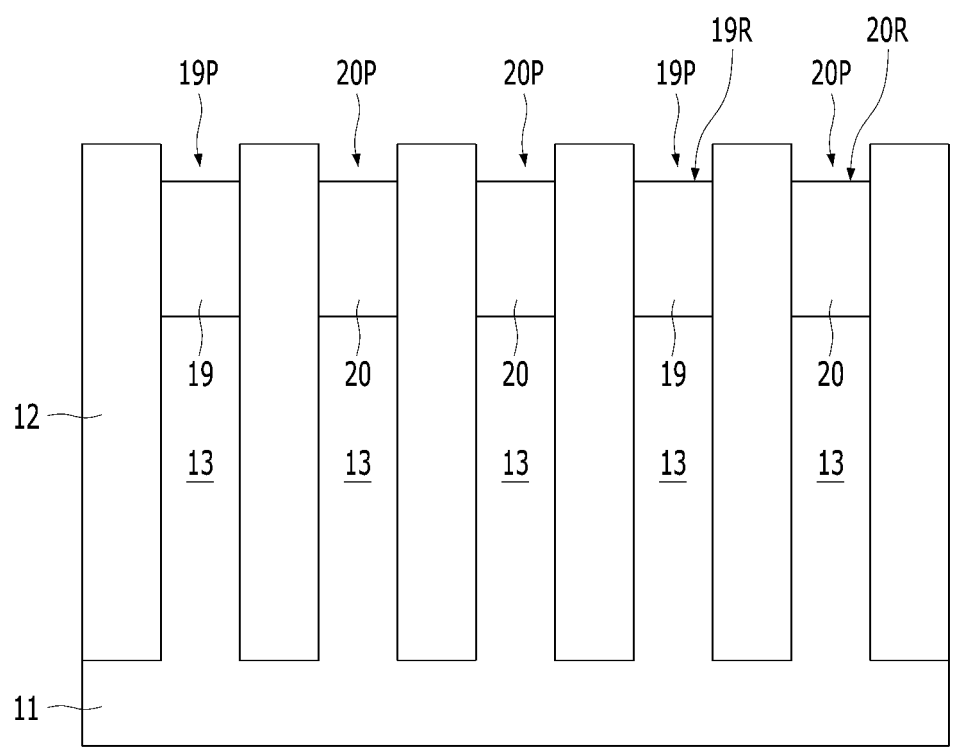
FIG. 20 is a view illustrating a fabrication method according to another embodiment of the present invention.

FIG. 20 is a view illustrating a fabrication method according to another embodiment. FIG. 20 is a modified example of FIGS. 5A and 5B.

Referring to FIG. 20, after the first impurity region 19 and the second impurity region 20 by performing the processes described with reference to FIGS. 2A to 4B, upper regions 19P of the first impurity regions 19 and upper regions 20P of the second impurity regions 20 may be recessed. Recessed surfaces 19R of the first impurity region 19 and recessed surfaces 20R of the second impurity region 20 may be at a lower level than upper surfaces of the device isolation layer 12.

Figure 21:
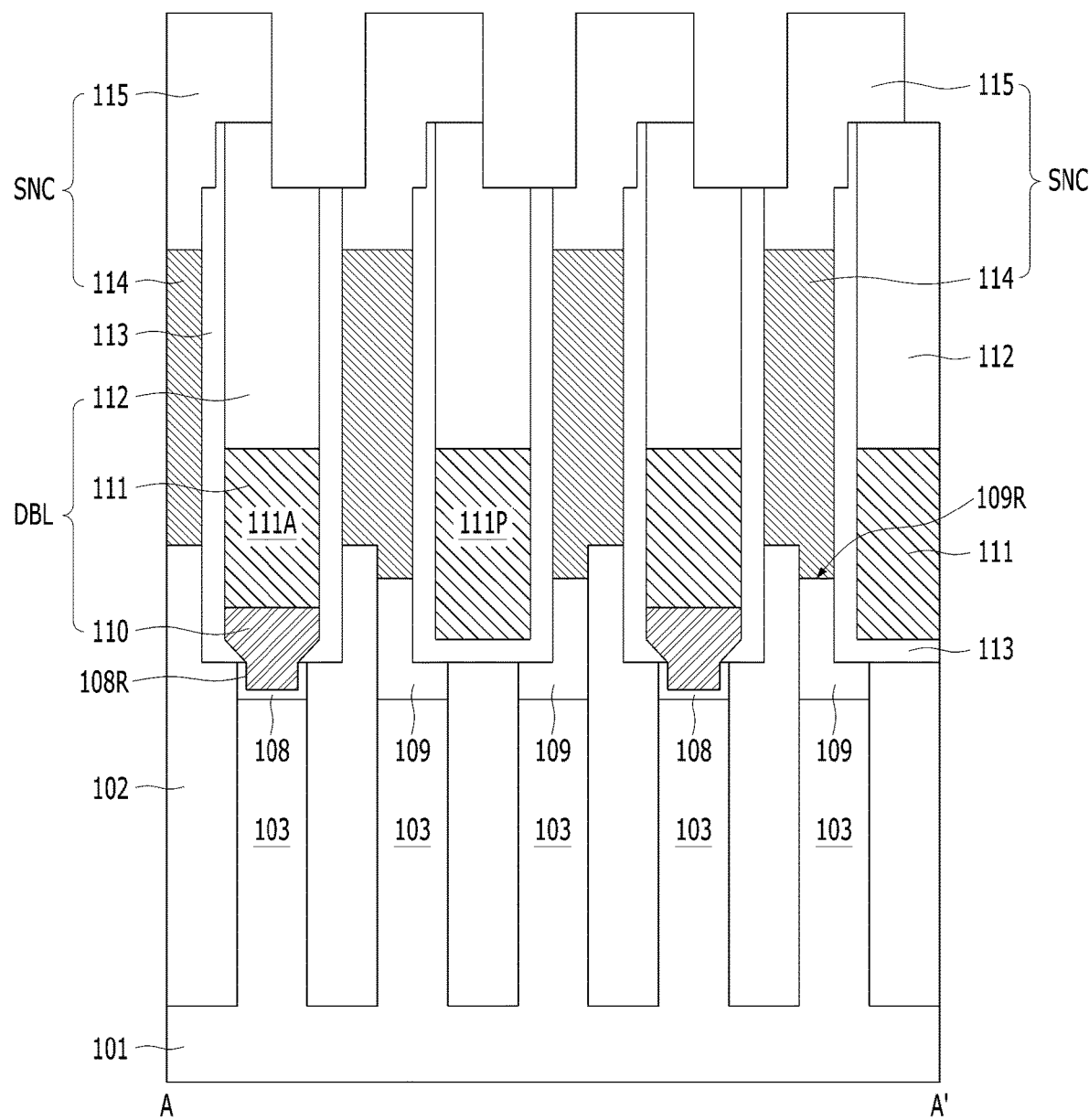
FIG. 21 is a detailed cross-sectional view illustrating a semiconductor device according to another embodiment of the present invention.

FIG. 21 is a detailed cross-sectional view of a semiconductor device according to another embodiment of the present invention. FIG. 21 is a modified example of FIG. 1B, in which second impurity regions 109 may be recessed (refer to reference numeral 109R). The recessed portion of the second impurity regions 109 may be a flat surface 109R, and the flat surface 109R may be positioned at a level lower than an upper surface of the device isolation layer 102. The flat surfaces 109R and the upper surface of the device isolation layer 102 may be connected to the upper-level plugs 114.

According to the above-described embodiment, it is possible to prevent residues and seams of the bit line contact plugs. In addition, voids in the storage node contact plug can be suppressed.

The present invention described above is not limited to the above-described embodiments and the accompanying drawings, and it will be apparent to those skilled in the art that various substitutions, modifications, and changes may be made thereto without departing from the spirit and scope of the present invention.

What is claimed is:

1. A semiconductor device comprising:
   an active region formed in a substrate, the active region including flat surfaces and hole-shaped recess portions;
   upper-level plugs disposed over the flat surfaces;
   a spacer disposed between the upper-level plugs, the spacer including a trench exposing the hole-shaped recess portions;
   a lower-level plug filling the hole-shaped recess portions; and
   a buried conductive line disposed over the lower-level plug and partially filling the trench.

2. The semiconductor device of claim 1, wherein a bottom surface of the spacer is positioned at a lower level than an upper surface of the lower-level plug.

3. The semiconductor device of claim 1, wherein the lower-level plug includes an epitaxial silicon layer filling the hole-shaped recess portions.

4. The semiconductor device of claim 1, wherein the buried conductive line includes:
   an active conductive line contacting the lower-level plug; and
   a passing conductive line extended from the active conductive line, and
   wherein the spacer extends along sidewalls and a bottom surface of the passing conductive line.

5. The semiconductor device of claim 4, wherein the spacer extends along sidewalls of the active conductive line and surrounds sidewalls of the lower-level plug.

6. The semiconductor device of claim 1, wherein a bottom surface of the spacer is positioned at a lower level than a bottom surface of the upper-level plugs.

7. The semiconductor device of claim 1, wherein a portion of the lower-level plug is in contact with the buried conductive line and has a line width greater than a portion of the lower-level plug filling the hole-shaped recess portions.

8. The semiconductor device of claim 1, wherein the lower-level plug includes an epitaxial silicon layer.

9. The semiconductor device of claim 1, further comprising:
   a device isolation layer formed in the substrate,
   wherein the flat surfaces of the active region are positioned at an upper level than an upper surface of the device isolation layer.

10. The semiconductor device of claim 1, further comprising:
    a device isolation layer formed in the substrate,
    wherein the flat surfaces of the active region are positioned at a lower level than an upper surface of the device isolation layer.

11. A semiconductor device comprising:
    an active region formed in a substrate, the active region including flat surfaces and hole-shaped recess portions;
    a gate trench formed in the active region between the hole-shaped recess portions and the flat surfaces;
    a buried word line partially filling the gate trench;
    upper-level plugs disposed over the flat surfaces;
    a spacer disposed between the upper-level plugs, the spacer including a trench exposing the hole-shaped recess portions;
    a lower-level plug filling the hole-shaped recess portions; and
    a buried bit line disposed over the lower-level plug and partially filling the trench.

12. The semiconductor device of claim 11, wherein a bottom surface of the spacer is positioned at a lower level than an upper surface of the lower-level plug.

13. The semiconductor device of claim 11, wherein the lower-level plug includes an epitaxial silicon layer filling the hole-shaped recess portions.

14. The semiconductor device of claim 11, wherein the buried bit line includes:
    an active bit line contacting the lower-level plug; and
    a passing bit line extending from the active bit line, and
    wherein the spacer extends along sidewalls and a bottom surface of the passing bit line.

15. The semiconductor device of claim 14, wherein the spacer extends along sidewalls of the active bit line and surrounds sidewalls of the lower-level plug.

16. The semiconductor device of claim 11, wherein a bottom surface of the spacer is positioned at a lower level than a bottom surface of the upper-level plugs.

17. The semiconductor device of claim 11, wherein a portion of the lower-level plug is in contact with the buried bit line and has a line width greater than a portion of the lower-level plug filling the hole-shaped recess portions.

18. The semiconductor device of claim 11, wherein the lower-level plug includes an epitaxial silicon layer.

19. The semiconductor device of claim 11, further comprising:
    a device isolation layer formed in the substrate,
    wherein upper surfaces of the hole-shaped recess portions are positioned at a lower level than an upper surface of the device isolation layer, and
    wherein upper surfaces of the flat surfaces are positioned at an upper level than the upper surface of the device isolation layer.

20. The semiconductor device of claim 11, further comprising:
    a device isolation layer formed in the substrate,
    wherein upper surfaces of the hole-shaped recess portion are positioned at a lower level than an upper surface of the device isolation layer,
    wherein upper surfaces of the flat surfaces are positioned at an upper level than the upper surface of the device isolation layer, and
    wherein the upper surfaces of the flat surfaces are positioned at an upper level than the upper surface of the hole-shaped recess portion.

21. The semiconductor device of claim 11, further comprising:
- a buried capping layer filling a remainder of the gate trench over the buried word line,
- wherein upper surfaces of the hole-shaped recess portions are positioned at a lower level than an upper surface of the buried capping layer, and
- wherein upper surfaces of the flat surfaces are positioned at an upper level than the upper surface of the buried capping layer.

* * * * *